US011152442B2

(12) United States Patent
Kishimoto et al.

(10) Patent No.: US 11,152,442 B2
(45) Date of Patent: Oct. 19, 2021

(54) ORGANIC ELECTROLUMINESCENT (EL) DISPLAY DEVICE WITH COMB-SHAPED SOURCE AND DRAIN ELECTRODES AND MANUFACTURING METHOD THEREFOR

(71) Applicant: SAKAI DISPLAY PRODUCTS CORPORATION, Sakai (JP)

(72) Inventors: Katsuhiko Kishimoto, Sakai (JP); Yukiya Nishioka, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/768,444

(22) PCT Filed: Mar. 28, 2018

(86) PCT No.: PCT/JP2018/012909
§ 371 (c)(1),
(2) Date: Jul. 6, 2020

(87) PCT Pub. No.: WO2019/186808
PCT Pub. Date: Oct. 3, 2019

(65) Prior Publication Data
US 2020/0388661 A1 Dec. 10, 2020

(51) Int. Cl.
*H01L 27/32* (2006.01)
*H01L 27/12* (2006.01)

(52) U.S. Cl.
CPC ...... *H01L 27/3262* (2013.01); *H01L 27/3248* (2013.01); *H01L 27/3258* (2013.01); *H01L 27/1214* (2013.01); *H01L 2227/323* (2013.01)

(58) Field of Classification Search
CPC ............. H01L 27/3262; H01L 27/3248; H01L 27/3258; H01L 2227/322
See application file for complete search history.

(56) References Cited

U.S. PATENT DOCUMENTS

| | | | |
|---|---|---|---|
| 2002/0115241 A1 | 8/2002 | Ando et al. | |
| 2005/0224820 A1* | 10/2005 | Yamazaki | H01L 27/124 257/79 |
| 2006/0275994 A1 | 12/2006 | Ando et al. | |
| 2008/0237535 A1* | 10/2008 | Maejima | H01L 21/02024 252/79.1 |

(Continued)

FOREIGN PATENT DOCUMENTS

| | | |
|---|---|---|
| JP | H02-275672 A | 11/1990 |
| JP | H03-245126 A | 10/1991 |

(Continued)

*Primary Examiner* — Thao X Le
*Assistant Examiner* — Xia L Cross
(74) *Attorney, Agent, or Firm* — ScienBiziP, P.C.

(57) ABSTRACT

By using an a-Si layer with low electron mobility in a TFT for driving an organic EL display device, the present invention solves problems stemming from uneven laser irradiation and suppresses the occurrence of non-uniform color and luminance. In the present invention, a first conductor film (26a) forming a drain electrode and a second conductor film (25a) forming a source electrode are disposed such that respective portions (26a1 . . . , 25a1 . . . ) of the first conductor film (26a) and the second conductor film (25a) are arranged in an alternating manner along a prescribed direction.

9 Claims, 14 Drawing Sheets

(56) References Cited

U.S. PATENT DOCUMENTS

| | | | |
|---|---|---|---|
| 2009/0075438 A1* | 3/2009 | Jo | H01L 27/3258 |
| | | | 438/155 |
| 2011/0001736 A1* | 1/2011 | Tanaka | H01L 27/124 |
| | | | 345/204 |
| 2011/0204367 A1* | 8/2011 | Nakatani | H01L 27/3274 |
| | | | 257/59 |
| 2012/0294102 A1 | 11/2012 | Ishizu | |
| 2013/0181214 A1* | 7/2013 | Yamazaki | H01L 29/7869 |
| | | | 257/43 |
| 2014/0326995 A1 | 11/2014 | Ishizu | |
| 2017/0271381 A1 | 9/2017 | Sone et al. | |
| 2018/0040640 A1 | 2/2018 | Takahashi et al. | |
| 2019/0355760 A1 | 11/2019 | Takahashi et al. | |

FOREIGN PATENT DOCUMENTS

| | | |
|---|---|---|
| JP | 2002-246604 A | 8/2002 |
| JP | 2004-356646 A | 12/2004 |
| JP | 2010-139920 A | 6/2010 |
| JP | 2010-277652 A | 12/2010 |
| JP | 2013-008437 A | 1/2013 |
| JP | 2017-011173 A | 1/2017 |
| JP | 2017-142378 A | 8/2017 |
| JP | 2017-175125 A | 9/2017 |
| JP | 2018-025777 A | 2/2018 |
| WO | 2009/104302 A1 | 8/2009 |
| WO | 2017/158843 A1 | 9/2017 |

\* cited by examiner

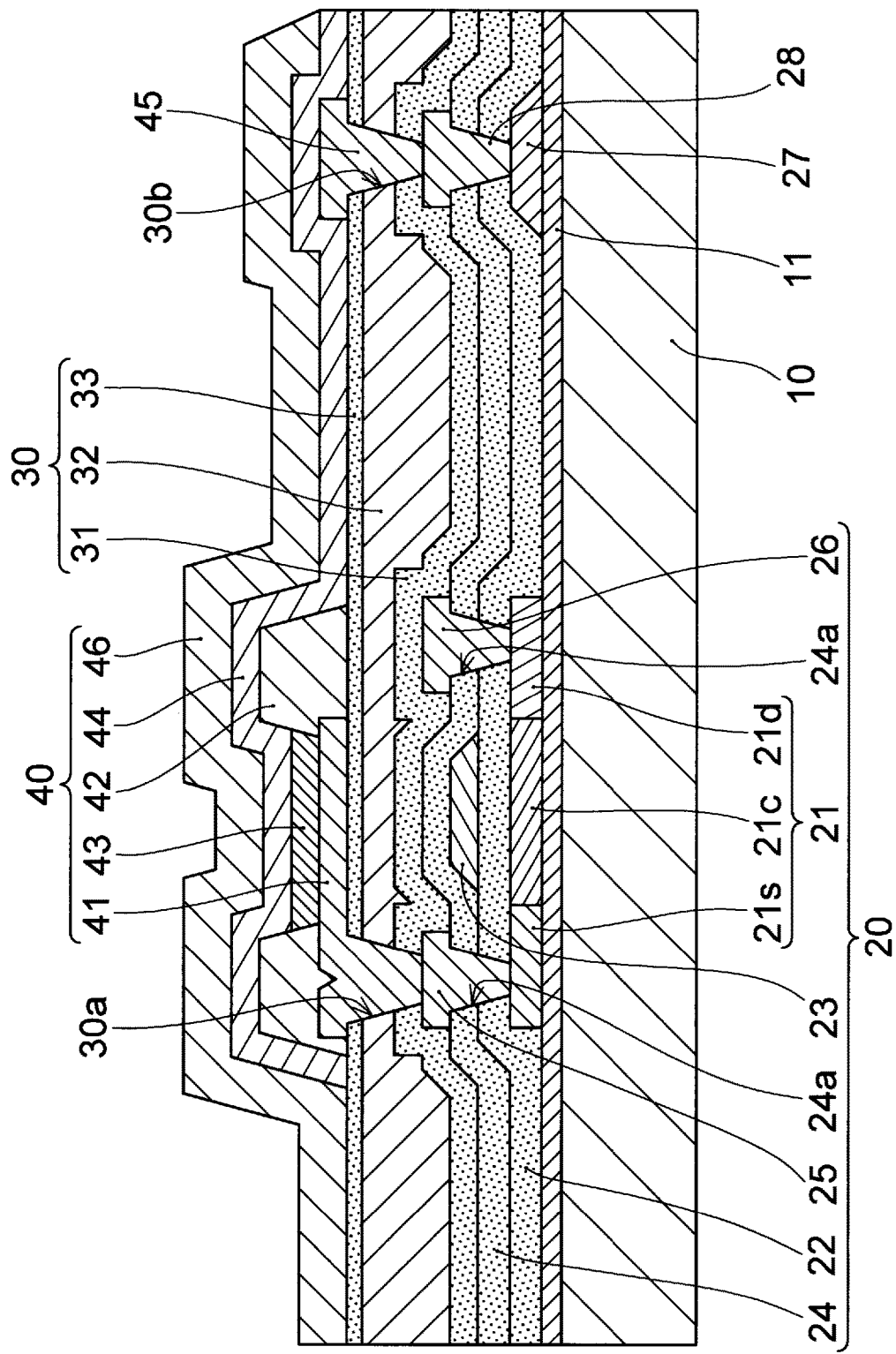

ORGANIC ELECTROLUMINESCENT (EL) DISPLAY DEVICE WITH COMB-SHAPED SOURCE AND DRAIN ELECTRODES AND MANUFACTURING METHOD THEREFOR

TECHNICAL FIELD

The present invention relates to an organic electroluminescent (EL) display apparatus and a method of manufacturing an organic EL display apparatus.

BACKGROUND ART

In recent years, there is a tendency to adopt an organic EL display apparatus for a large sized television and a mobile apparatus. The organic EL display apparatus is configured by a drive circuit being formed on an insulating substrate, the drive circuit using a thin film transistor (below also called a TFT) as an active element such as a switching element or a drive element in each pixel region, and an organic light emitting element for each pixel being formed on the drive circuit so as to connect to the TFT. The organic EL display apparatus can be categorized into a top emission type in which a front surface of the light emitting element is a display surface and a bottom emission type in which a rear surface of the insulating substrate is a display surface. In the top emission type, the previously-described drive circuit can be formed below the display region of the organic light emitting element, not out of the display region of the organic light emitting element. On the other hand, in the bottom emission type, the drive circuit is formed at the peripheral edge of the display region. Therefore, for a small sized organic EL display apparatus such as a mobile apparatus having a small space to form the drive circuit, the top emission type, or in other words, a configuration such that the drive circuit such as the TFT is formed below almost the entire surface of the display region is often used. On the other hand, the bottom emission type is suitable for the large sized television having some space to spare between pixels.

A semiconductor of the TFT to be used for this drive circuit is formed by depositing a semiconductor layer comprising amorphous silicon. However, the amorphous silicon (below called a-Si) has a small electron mobility, so that, in a case that a large current is needed, it is used by converting it into polycrystalline silicon (LTPS) by irradiating a laser light thereon. A large current needs to be passed through the TFT as an element to drive the organic EL display apparatus since the organic light emitting element (OLED) is current driven. Therefore, it is essential to modify amorphous silicon into polycrystalline silicon.

Moreover, forming the drive circuit with the TFT causes the surface thereof to be uneven. As the organic light emitting element is formed on the drive circuit, a planarizing layer is formed by covering the drive circuit with a resin material. In this way, planarizing of the surface is carried out. The planarizing layer is conventionally obtained as follows. After the TFT is formed, a first inorganic insulating layer to be a barrier layer is formed, and a contact hole to connect the previously described organic light emitting element and the TFT is formed by photolithography process, and a photosensitive organic insulating layer is formed on the first inorganic insulating layer and a contact hole is formed so as to be connected with the previously described contact hole, using a photolithography process and wet development. In this way, forming the organic insulating layer allows unevenness of the surface due to forming of the TFT to be planarized.

Patent document 1 discloses a TFT and a manufacturing method thereof to achieve both a small occupation area and excellent transistor characteristics, the TFT and the manufacturing method being suitable for a switching element for each pixel of an active matrix type display apparatus. Therein, multi-layer TFTs are integrally formed vertically by forming TFTs having the same configuration via an interlayer insulating layer whose surface unevenness is made to be no more than 20 nm by a CMP process. In other words, in forming multi-layer fine TFTs, the planarity of the surface of the interlayer insulating layer between the multi-layer TFTs requires to be made in no more than 20 nm to deal with a small depth of focus. Therefore, this planarizing is different from an intent to planarize an organic insulating layer which is an under layer for an organic light emitting device over the TFT.

PRIOR ART DOCUMENT

Patent Document

Patent Document 1: JP 2017-011173 A

SUMMARY OF THE INVENTION

Problem to be Solved by the Invention

As described previously, in an organic EL display apparatus, a large current passes through a drive element, so that an adequate operation cannot be obtained with a-Si. However, when a-Si is converted into polycrystalline silicon by irradiating a laser light thereon, it is difficult to irradiate, onto a large area, a laser light having a uniform intensity. In particular, with a large number of units being formed at once using a large mother substrate in the manufacturing stage in conjunction with upsizing of display apparatuses and reduced prices of electronic apparatuses in recent years, the size of the mother substrate for a liquid crystal display apparatus, for example, is being upsized from G6 (approximately 1500 mm×1850 mm) to G12 at the present, and, even with G10, it is approximately 2850 mm×3050 mm. When the laser light is to be irradiated onto such a large-sized mother substrate the irradiation is carried out while scanning a partial irradiation thereon. However, even the partial irradiation, it does not make the intensity of laser light uniform, still more irradiating the laser light while scanning results in a very non-uniform irradiation. The intensity of the laser light being different causes the degree of conversion into polycrystalline silicon to differ, so that even the same voltage causes the drive current to differ. There is a problem that the drive current differing for each pixel causes luminance to vary depending on the pixel, causing display non-uniformity such as luminance non-uniformity or color non-uniformity. On this point, the organic EL display apparatus being current driven is significantly different from the organic crystal display apparatus being voltage-driven.

Moreover, irradiating a laser light on a large mother substrate while scanning a laser light source can be large scale from an apparatus viewpoint, and can be a cause of a cost increase.

While a method to further incorporate TFTs to compensate display non-uniformity circuit-wise can also be considered to overcome luminance non-uniformity depending on the pixel as described previously, there is a problem that an increase in the number of TFTs causes unevenness to further increase at the lower end of a light emitting region of a light emitting element. While an organic insulating layer is formed on a drive circuit such as a TFT and an organic light emitting element is formed on the organic insulating layer, as a result of the present inventors having studied with respect to the above, it has been found that a sufficient planarity cannot be obtained with planarizing by the organic insulating layer, so that the non-planarity causes display non-uniformity such as luminance non-uniformity or color non-uniformity to occur.

Moreover, in a conventional organic light emitting element, it is practiced to increase a light emitting output by making a microcavity by providing a layer with a large reflectance on a surface of the organic light emitting layer. In this case, there occurs unevenness on the surface of the organic light emitting layer, and thereby, unevenness is formed even on the reflective layer, so that a light from the organic light emitting layer reflects irregularly, and it is not possible to effect a complete resonator. Therefore, there is a problem that, it is not possible to obtain an increase in output.

On the other hand, in the present invention, as it is not an object to manufacture a fine TFT, it is not required to form a strict surface planarity at no more than 20 nm as disclosed in the previously described Patent Document 1. It suffices to have such a planarity degree that light emitted from the organic light emitting layer enters substantially to the front surface of the display with a peak in about the center.

An object of the present invention being made in view of such circumstances as described above is to provide an organic EL display apparatus having an improved display quality and a manufacturing method thereof by providing, with a-Si, a TFT structure in which a sufficient current can be obtained without converting a-Si into polycrystalline silicon to substantially decrease the cost of the organic EL display apparatus and suppress an occurrence of color non-uniformity and/or luminance non-uniformity with stable quality.

Another object of the present invention is to provide an organic EL display apparatus having an improved display quality and a manufacturing method thereof by carrying out planarizing of a surface of a drive circuit even when the TFT structure becomes complex to increase drive current to suppress color non-uniformity and/or luminance non-uniformity of the organic EL display apparatus.

Means to Solve the Problem

An organic EL display apparatus according to one embodiment of the present invention comprises: a substrate having a surface on which a drive circuit comprising a thin film transistor is formed, a planarizing layer to planarize the surface of the substrate by covering the drive circuit, and an organic light emitting element, the organic light emitting element comprising a first electrode being formed on a surface of the planarizing layer and connected to the drive circuit, an organic light emitting layer being formed on the first electrode, and a second electrode being formed on the organic light emitting layer, wherein the thin film transistor comprises a gate electrode, a drain electrode, a source electrode, and a region to be a channel of the thin film transistor, and has a stack structure comprising the gate electrode, a semiconductor layer, and a first conductor layer and a second conductor layer, the first conductor layer making up the drain electrode being formed in connection with the semiconductor layer and the second conductor layer making up the source electrode; wherein the first conductor layer and the second conductor layer are arranged such that portions of each of the first conductor layer and the second conductor layer are lined up alternately in a predetermined direction; and wherein the channel is the semiconductor layer being sandwiched between a portion of the first conductor layer and a portion of the second conductor layer, the portion of the first conductor layer and the portion of the second conductor layer neighboring each other.

A method of manufacturing an organic EL display apparatus according to another embodiment of the present invention comprises: forming a drive circuit on a substrate, the drive circuit comprising a thin film transistor; forming, on a surface of the drive circuit, a first inorganic insulating layer and an organic insulating layer; polishing a surface of the organic insulating layer by CMP; forming a contact hole in the organic insulating layer and the first inorganic insulating layer, the contact hole to reach the thin film transistor; embedding a metal at an interior of the contact hole and forming a first electrode at a given region; forming an organic light emitting layer on the first electrode; and forming a second electrode on the organic light emitting layer, wherein the thin film transistor comprises a gate electrode, a gate insulating layer, and a region to be a channel and is formed with a stack structure comprising the gate electrode, a semiconductor layer being amorphous, a first conductor layer to make up a drain electrode being formed in connection to the semiconductor layer, and a second conductor layer to make up a source electrode being formed in connection to the semiconductor layer; wherein the first conductor layer and the second conductor layer are formed such that portions of the first conductor layer and the second conductor layer are alternately lined up in a predetermined direction; and wherein the channel is the semiconductor layer being sandwiched between a portion of the first conductor layer and a portion of the second conductor layer, the portion of the first conductor layer and the portion of the second conductor layer neighboring each other.

Effects of the Invention

According to the embodiment of the present invention, a channel width can be greatly increased and the channel length can be shortened, making it possible to pass a very large current. Therefore, even when a-Si is used for a semiconductor layer of a drive TFT of an organic EL light emitting element, a sufficient drive current can be supplied. This makes irradiating of a laser light for converting a-Si into polycrystalline silicon unnecessary, making it possible to carry out manufacturing at a very low cost. Even more, there is no need to irradiate a laser light having a non-uniform intensity, so that making the TFT characteristics uniform is achieved. Therefore, an occurrence of display non-uniformity such as color non-uniformity or luminance non-uniformity is suppressed, making it possible to obtain an organic EL display apparatus being excellent in the display quality.

BRIEF DESCRIPTION OF THE DRAWINGS

FIG. 1C shows an example of a TFT structure being suitable for polycrystalline silicon according to the same structure as in FIG. 1B.

EMBODIMENT FOR CARRYING OUT THE INVENTION

An organic EL display apparatus being one embodiment of the present invention will be described below with reference to the drawings. FIG. 1 schematically shows a cross-sectional view of what corresponds to one pixel (while it, more strictly, refers to sub-pixels of red, green, and blue in one pixel), the present specification can also include these sub-pixels to refer thereto.

Figure 1A:
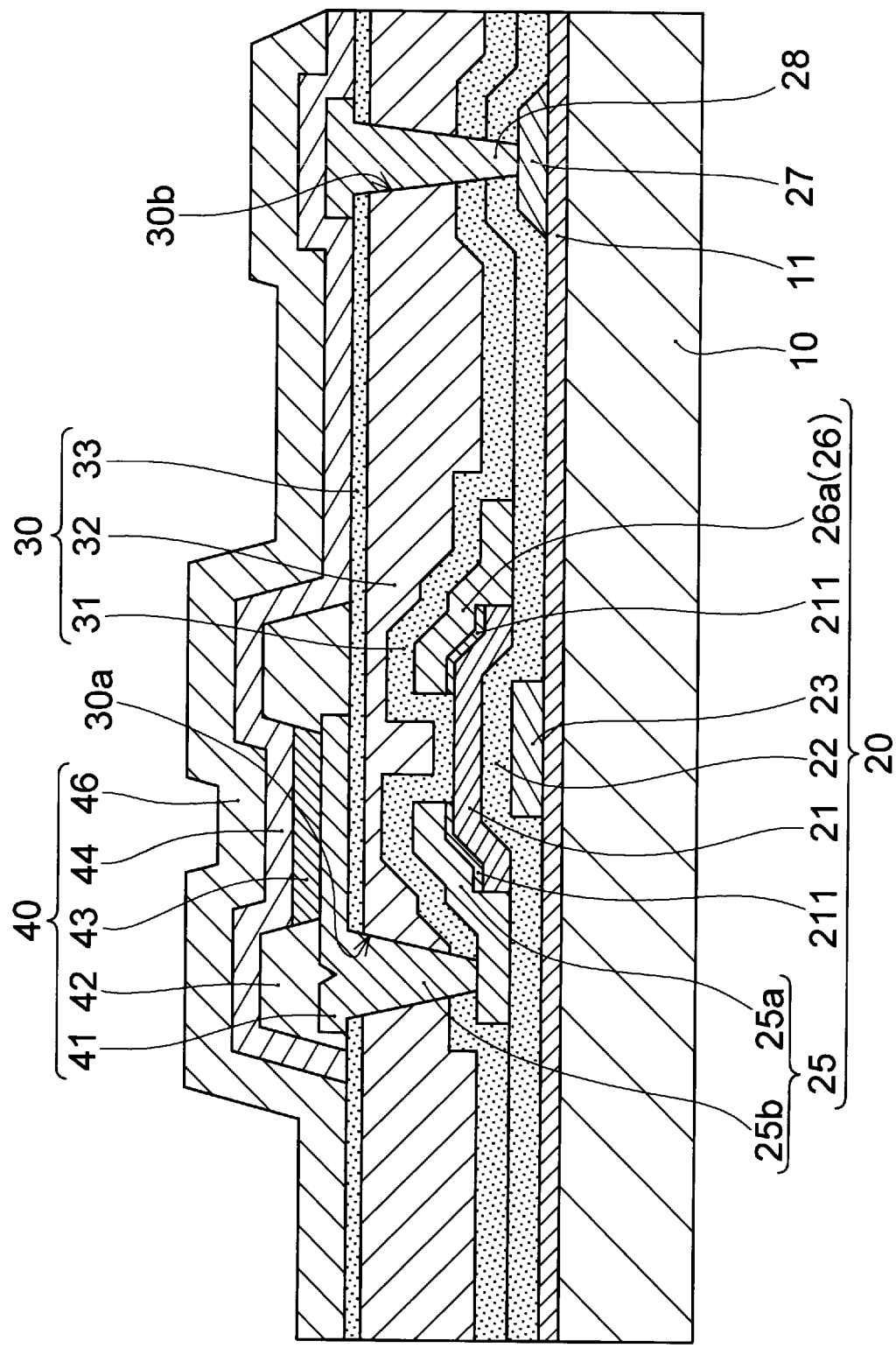
FIG. 1A shows a cross-sectional view of an organic EL display apparatus according to one embodiment of the present invention.
Figure 2A:
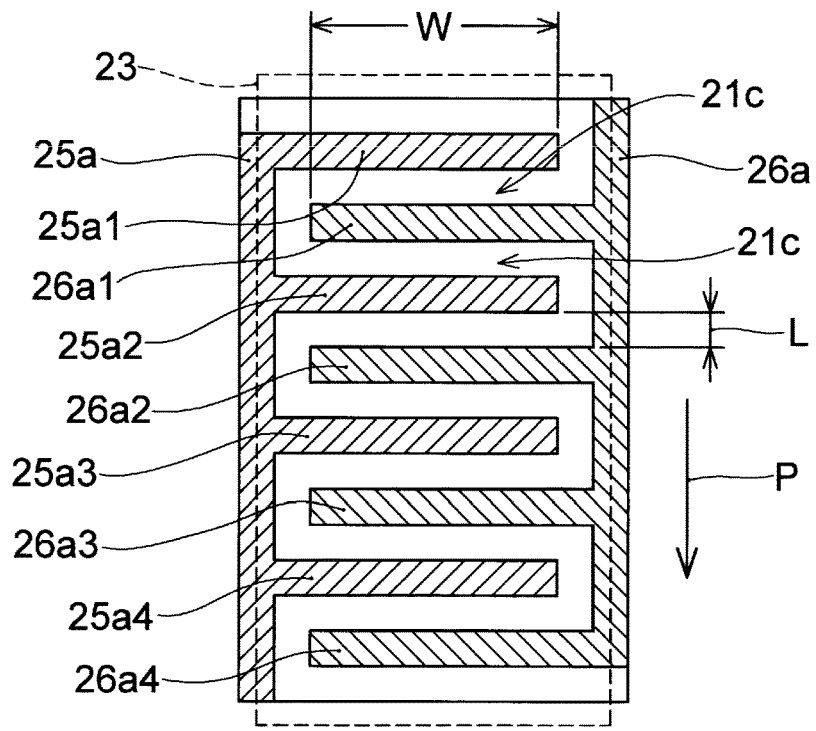
FIG. 2A shows an explanatory view of a plane to explain a channel portion in FIG. 1.

An organic EL display apparatus according to one embodiment of the present invention, as shown in FIG. 1A being a cross-sectional view thereof and in FIG. 2A being an explanatory view of a plane of the structure of a channel portion thereof, comprises: a substrate 10 having a surface on which a drive circuit comprising a thin film transistor 20 is formed, a planarizing layer 30 to planarize the surface of the substrate 10 by covering the drive circuit, and an organic light emitting element 40, the organic light emitting element 40 comprising a first electrode 41 being formed on a surface of the planarizing layer 30 and connected to the drive circuit, an organic light emitting layer 43 being formed on the first electrode 41, and a second electrode 44 being formed on the organic light emitting layer 43. Then, the thin film transistor 20 comprises a gate electrode 23, a drain electrode 26, a source electrode 25, and a region to be a channel 21c of the thin film transistor 20 and has a stack structure of a gate electrode 23, a semiconductor layer 21, and a first conductor layer 26a and a second conductor layer 25a, the first conductor layer 26a making up the drain electrode 26 to be formed in connection with the semiconductor layer 21 and the second conductor layer 25a making up the source electrode 25, the first conductor layer 26a and the second conductor layer 25a are arranged such that portions of the first conductor layer 26a, 26a2 . . . of the first conductor layer 26a and portions of the second conductor layer 25a1, 25a2 . . . of the second conductor layer 25a are alternately lined up along a predetermined direction P (see FIG. 2A) and the channel 21c is formed by the semiconductor layer 21 being sandwiched between the portions of the first conductor layer 26a and the portions of the second conductor layer 25a, the portions of the first conductor layer and the portions of the second conductor layer neighboring each other.

In other words, in the organic EL display apparatus according to the present embodiment, as the drive TFT 20 of the organic light emitting element 40, it is attempted to use the semiconductor layer 21 being amorphous having a small electron mobility, and, as a result of the present inventors having carried out intensive studies, it was found that increasing the channel width of the drive TFT makes it possible to obtain a large current and to drive the organic light emitting element 40. As described previously, conventionally, a large current could be passed therethrough by converting a-Si into a low temperature polycrystalline silicon by irradiating a laser light on a-Si. However, uniformly irradiating a laser light on a large mother substrate is very cumbersome and result in a very high cost and uniformly irradiating a laser light on the entire surface of the large substrate 10 is difficult even when irradiation of the laser light is carried out with close attention thereto, causing a case in which a sufficient current cannot be obtained depending on the pixel. This causes display non-uniformity such as color non-uniformity or luminance non-uniformity.

According to the present embodiment, a large current is obtained by increasing the channel width using a-Si, so that there are no variations in the TFT characteristics based on irradiating of the laser light, making it possible to drive the organic light emitting element of each pixel with a TFT, the characteristics thereof being uniform. This makes the manufacturing process very easy, makes it possible to achieve a cost reduction, and makes it possible to obtain an organic EL display apparatus whose quality is stable, or, in other words, an excellent organic EL display apparatus whose display quality is such that it has no display non-uniformity. It is explained bellow to obtain a concrete structure of increasing the channel width.

Figure 1B:
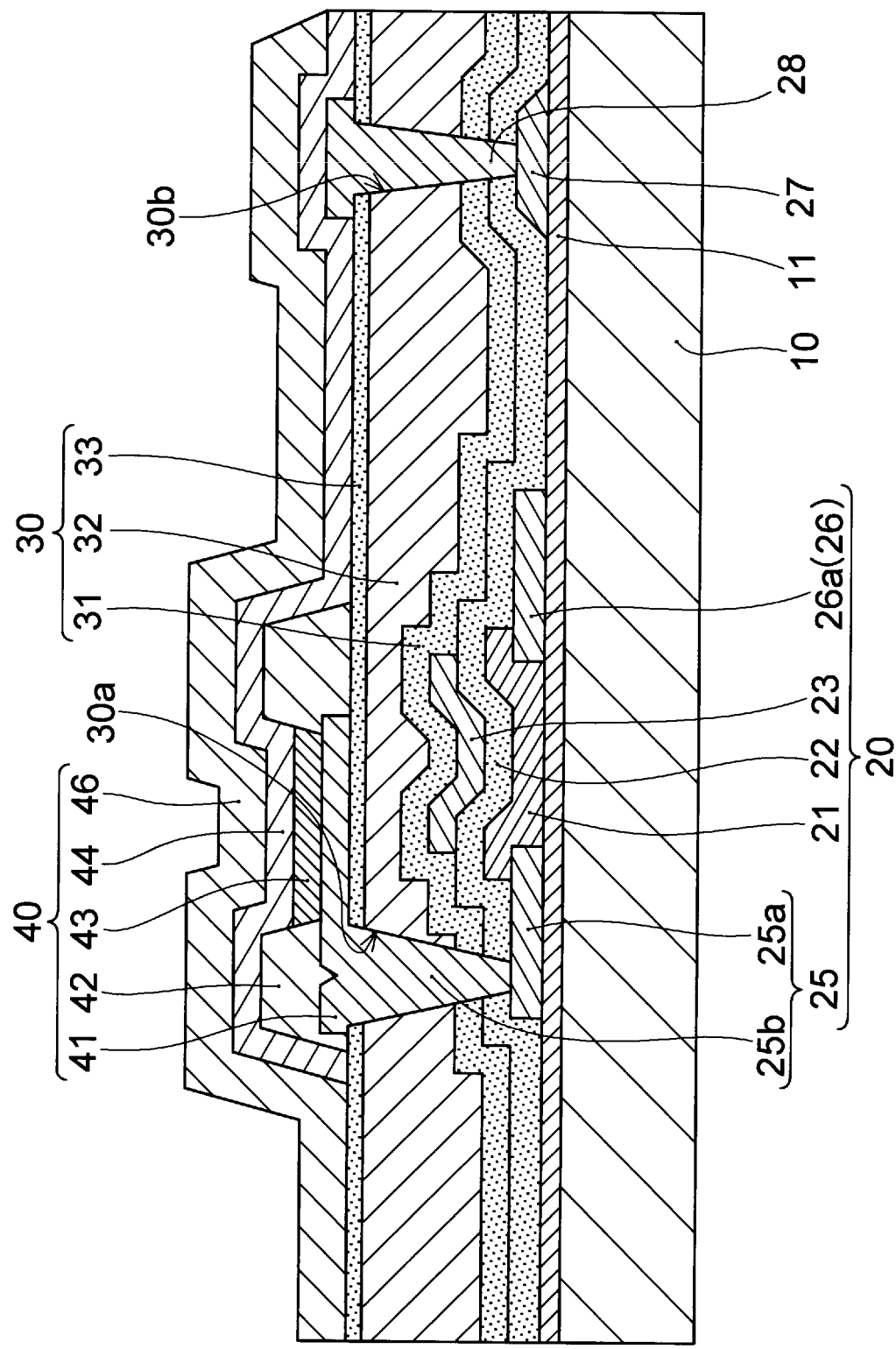
FIG. 1B shows a cross-sectional view of a staggered structure with a gate electrode in FIG. 1A being set to be the top gate.

The TFT 20 according to the present embodiment can be formed in a reverse-staggered structure or a staggered structure as shown in FIGS. 1A to 1C. FIG. 1A shows the TFT 20 having the bottom gate structure being the reverse-staggered structure. FIGS. 1A to 1C are views corresponding to some cross sections along a predetermined direction P in FIG. 2A. FIG. 1B shows the staggered structure being the top gate. While FIG. 1C shows a structure being suitable for polycrystalline silicon, it shows a structure being applicable also to a-Si. As FIGS. 1B and 1C are merely different from FIG. 1A in the stack structure based on a difference being whether the gate electrode 23 is in an underlayer or an overlayer, the same portions as those in FIG. 1A are affixed with the same letter, so that the explanations thereof will be omitted.

In the example in FIG. 1A, the gate electrode 23 is formed via a base coat layer 11. On this occasion, a cathode wiring 27 and other wirings not shown are also formed at the same time. A gate insulating layer 22, the semiconductor layer 21 comprising a-Si, and the second conductor layer 25a comprising the source electrode 25 and the first conductor layer 26a comprising the drain electrode 26 are deposited thereon. In the example shown in FIG. 1A, a second semiconductor layer 211 having a high impurities concentration is interposed between the semiconductor layer 21 and the first conductor layer 26a and the second conductor layer 25a to make a good electrical contact with the first conductor layer 26a and the second conductor layer 25a, respectively. However, this is not essential, so that impurities can be doped to a portion of the semiconductor layer 21, the portion to which the first conductor layer 26a and the second conductor layer 25a are connected. According to the present embodiment, the channel 21c of the semiconductor layer 21 (see FIG. 2A) is formed such that the channel width is increased. In other words, as shown in FIG. 2A, portions 26a1, 26a2 . . . , and portions 25a1, 25a2 . . . in which the first conductor layer 26a and the second conductor layer 25a are branched as comb teeth, respectively, are formed and the first conductor layer 26a and the second conductor layer 25a are formed such that the respective comb teeth engage with each other.

Figure 3A:
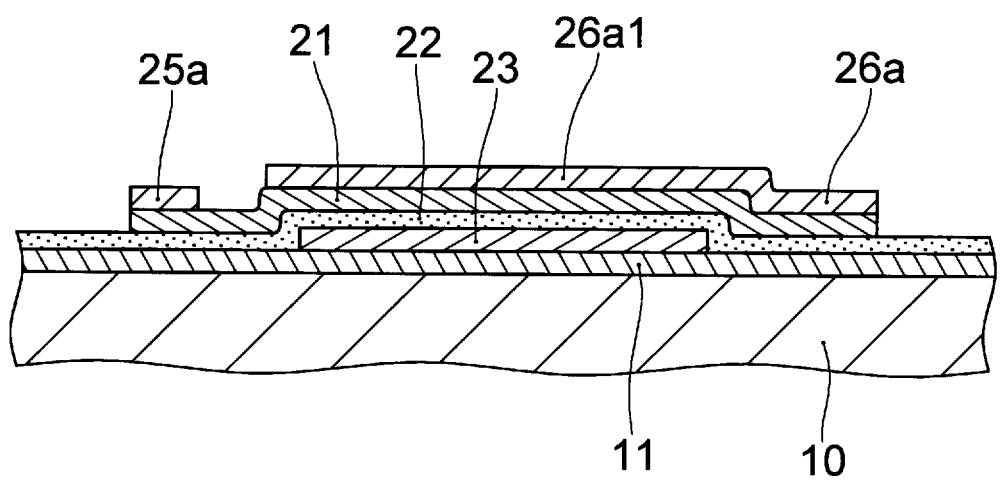
FIG. 3A shows a cross-sectional view of a first portion in FIG. 2A according to the structure in FIG. 1A.
Figure 3B:
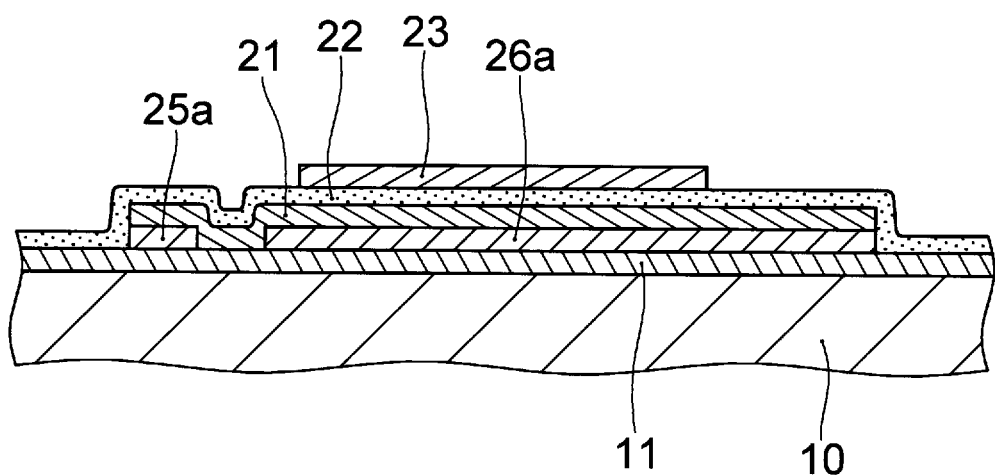
FIG. 3B shows a cross-sectional view of the first portion in FIG. 2A according to the structure in FIG. 1B.

In FIG. 2A being an explanatory view of a plane of a channel portion, a region shown with broken lines is a gate electrode 23 and a semiconductor layer 21 (not shown) is formed to cover the gate electrode 23 via a gate insulating layer (not shown). The first conductor layer 26a and the second conductor layer 25a are formed in connection with the semiconductor layer 21. This stack structure can be a reverse-staggered structure as shown in FIG. 1A or a staggered structure as shown in below-described FIG. 1B. As an exemplary structure of a cross section along the first portion 26a1 (a stack structure, not an accurate cross-sectional view is shown) in FIG. 2A shows, FIG. 3A shows an exemplary reverse-staggered structure while FIG. 3B shows an exemplary staggered structure. In FIGS. 3A and 3B, the same letters are affixed to the same portions as those shown in FIGS. 1A and 2A, so that explanations thereof will be omitted.

As shown in FIG. 2A, the first conductor layer 26a and the second conductor layer 25a are formed such that the first portions 26a1, 26a2, 26a3, 26a4 and the second portions 25a1, 25a2, 25a3, and 25a4 are alternately arranged in a predetermined direction P, the first portions 26a1, 26a2, 26a3, 26a4 being parts of the first conductor layer 26 and the second portions 25a1, 25a2, 25a3, and 25a4 being parts of the second conductive layer 25.

In other words, a portion of a semiconductor layer (not shown) being sandwiched between the second portion 25a1 and the first portion 26a1, the second portion 25a1 being a part of the second conductor layer 25a and the first portion 26a1 being a part of the first conductor layer 26a, is to be the channel 21c. The same applies thereafter, so that the channel 21c is formed in a portion of the semiconductor layer, the portion being sandwiched between a first portion 26an and a second portion 25an, the first portion 26an and the second portion 25an being alternately arranged and neighboring each other. Therefore, the channel width is a sum of all of portions to which the first portion 26an and the second portion 25an of comb teeth being engaged with each other oppose, the first portion 26an and the second portion 25an neighboring each other. A top emission type small-sized display apparatus such as a smartphone can be formed on the whole surface of a light emitting region of the organic light emitting element 40, making it possible to form a large number of channels 21c. As a result, the channel width can be increased, making it possible to pass a large current therethrough even when the electron mobility is small.

Assuming that the length of a portion to which a set of the second portion 25a1 and the first portion 26a1 opposes is w and the number of opposing portions is n, a channel width W of the TFT is a sum of all thereof, or W=n·w. On the other hand, a channel length L is an interval between the second portion 25a1 and the first portion 26a, so that the channel length is to be L in a case that all of the intervals between the second portion 25a1 and the first portion 26a1 are set to be equal. Therefore, a ratio W/L between the channel width W and the channel length L can be increased. While the value of W/L is approximately 2.5 conventionally, according to the present embodiment, it can be set to be 50 to 500. In other words, increasing W/L makes it possible to increase current, so that, while contribution of an increase in current from converting a-Si into polycrystalline silicon is approximately 20 times, the present embodiment makes it possible to increase it from approximately 20 times to approximately 200 times.

With the interval between portions (portions having the length w) to which the first portion 26an and the second portion 25an being lined up in the predetermined direction oppose being constant, the structure shown in FIG. 2A stably contributes as a channel. However, as shown in FIG. 2A, in a case that the gate electrode 23 is being formed such that it has large dimensions, a channel is formed in each of spaces between a tip portion of the second portion 25a1 and opposing the first conductor layer, and between a tip of the first portion 26a1 and opposing the second conductor layers 25a. Therefore, in a case that this interval is formed also with a required minimum channel length of L, the channel width further increases. However, contribution as a channel of an edge portion of a tip of the first portion 26a1 or the second portion 25a1 is unclear, the contribution of the tip portion is not included in the previously-described W/L.

Figure 2B:
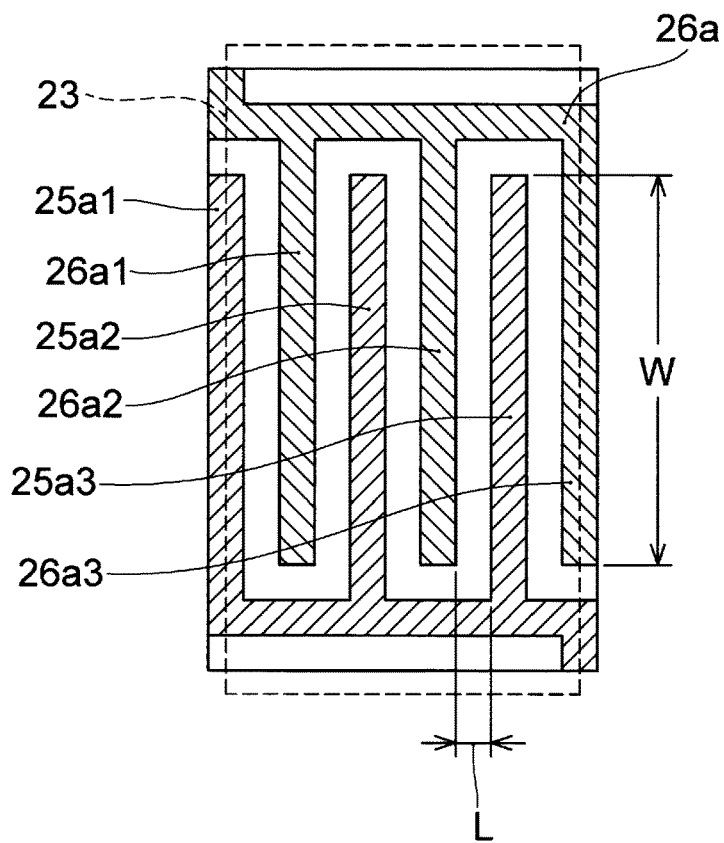
FIG. 2B shows a view of a different arrangement example of a first conductor layer and a second conductor layer in FIG. 2A.

From the viewpoint, in a case that a light emitting region (a region of the organic light emitting layer 43) of the organic light emitting element 40, or, in other words, a region in which a channel being a region of a projection image is to be formed, the region being an entire region of the under layer below the organic light emitting layer 43, has a rectangular shape, as shown in FIG. 2B, when the first portion 26a1 and the second portion 25a1 are formed along the longer side thereof, a fixed length W of the channel width can be increased. In FIG. 2B, the explanations thereof are omitted with portions being the same as those in FIG. 2A being affixed the same letters. In other words, a region avoiding the influence of a tip portion of the first portion 26a1 or the like can be increased.

Figure 2C:
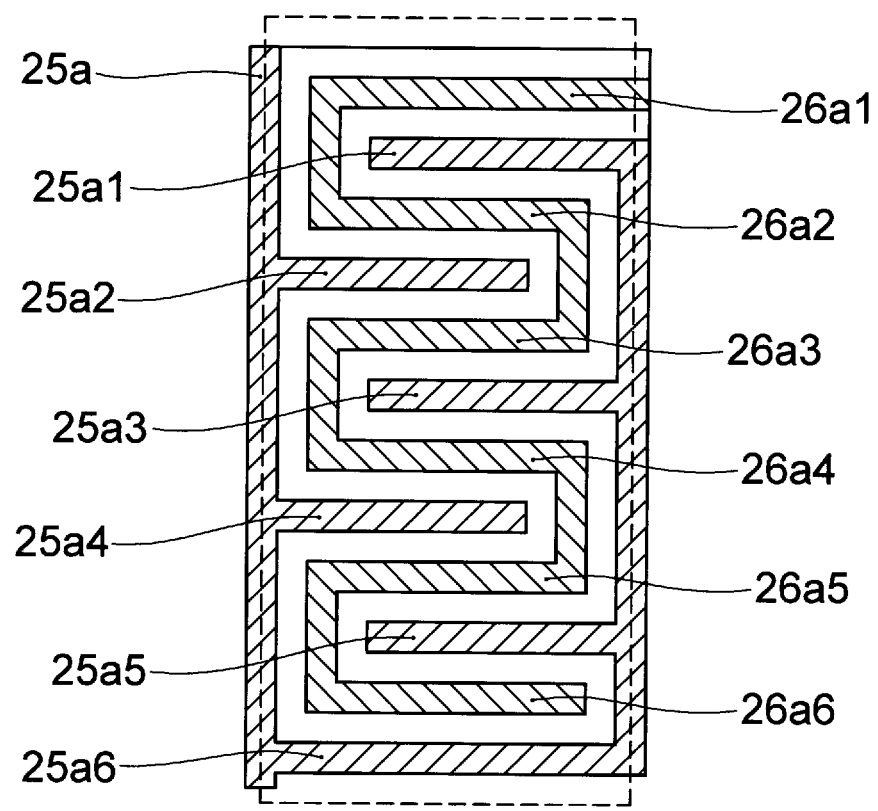
FIG. 2C shows a view of a further different arrangement example of the first conductor layer and the second conductor layer in FIG. 2A.

FIG. 2C shows a further different example of the structure in which the channel 21c is to be formed. In other words, the structure is such that the first portions 26a1, 26a2 . . . being parts of the first conductor layer 26a are continuously formed in a zig-zag shape, not in a shape being branched in a comb-tooth shape from the first conductor layer 26a, the second portions 25a1 . . . of the second conductor layer 25a being inserted therebetween to cause the first portion 26a1 . . . of the first conductor layer 26a and the second portion 25a1 . . . of the second conductor layer 25a to be alternately arranged. Therefore, the structure is such that the second portions 25a1 . . . of the second conductor layer 25a are inserted from both left and right ends of FIG. 2C and are connected by the second conductor layer 25a. In other words, the structure in which the first portions 26a1 . . . and the second portions 25a1 . . . are alternately arranged is not limited to the structure in which comb-toothed shaped comb teeth are engaged with each other as shown in FIG. 2A. In FIG. 2C, the explanations thereof are also omitted with portions being the same as those in FIG. 2A being affixed the same letters.

As described previously, as a result of the present inventors having carried out intensive studies on the cause that color non-uniformity and/or luminance non-uniformity of the organic EL display apparatus occurs, it was found that the cause is unevenness on the surface of the organic light emitting layer 43 of the organic light emitting element 40. In other words, it was found that the cause is that there is unevenness on the surface of the organic light emitting layer 43 and the surface of the organic light emitting layer 43 is not completely planar when viewed microscopically, or, in other words, the normal direction of the surface of the organic light emitting layer 43 is inclined in various directions relative to the normal direction of the display surface. Then, in a case of visually recognizing from a direction perpendicular to the display surface, it becomes difficult to recognize light of a pixel for which light emitted travels in a slanted direction, causing deterioration in luminance or a color of mixed colors to change. In other words, light emitted having maximum luminance in the normal direction thereof will have luminance thereof decreasing as it is inclined relative to the normal direction. With a small-sized display apparatus such as a smartphone, the size of this sub-pixel is very small with one side of a few tens of μm. Therefore, even with slight unevenness, light emitted toward the front becomes very weak for a sub-pixel having unevenness on the surface of the organic light emitting layer 43.

According to the present embodiment, as described previously, it was found that the cause of color non-uniformity and/or luminance non-uniformity is unevenness on the surface of the organic light emitting layer 43, so that, to improve the planarity of the surface of the organic light emitting layer 43, the planarity of the surface of the planarizing layer 30 to be a base of the light emitting element is brought to less than or equal to 50 nm and the organic light emitting layer 43 is formed while avoiding a portion being immediately above a contact hole 30a to almost suppress an occurrence of color non-uniformity and/or luminance non-uniformity. It was found that, while the smaller the surface roughness the more preferable, bringing the planarity to less than or equal to 20 nm as shown in previously-described Patent Document 1 is not required, so that the color non-uniformity or luminance non-uniformity almost does not occur even when the arithmetic average roughness Ra is greater than or equal to 20 nm. In other words, while the smaller the surface roughness the more preferable, so that no lower limit is set, but the polishing work gets cumbersome to decrease the surface roughness, so that bringing the surface roughness to 20 nm or more and less than or equal to 50 nm is preferable.

More specifically, with the conventional method, with respect to the above-mentioned planarizing layer, an inorganic barrier layer is formed, then a contact hole is formed by wet etching, and an organic insulating layer (a photosensitive resin) is formed thereon to form a contact hole by wet etching. In other words, as described previously, there was believed to be no problem as the surface is planarized since the organic insulating layer is formed by applying a liquid resin. However, the planarity of the surface of the above-mentioned organic insulating layer is approximately 100 nm to 300 nm in the arithmetic average roughness Ra even when a non-photosensitive resin is used, the above-mentioned planarity is greater than the above with a photosensitive resin, and the present inventors having found that planarizing to such a degree is not sufficient. In this case, when the photosensitive resin is used, the surface roughness further increases due to the influence of a photopolymerization initiator to be mixed thereinto. Then, as described previously, it has been found that an occurrence of color non-uniformity and/or luminance non-uniformity can be almost suppressed by bringing the surface roughness to greater than or equal to 20 nm and less than or equal to 50 nm in the arithmetic average roughness Ra through polishing the surface of an organic insulating layer 32 using CMP. In other words, while it is not required to bring the planarity to less than or equal to 20 nm as disclosed in the previously-described Patent Document 1, it is required to bring the planarity to less than or equal to approximately 50 nm. The planarizing layer 30 is formed by further forming a second inorganic insulating layer 33 on the surface of the organic insulating layer 32 and, in the example in FIG. 1A, the second inorganic insulating layer 33 is also formed. Even in this case, the planarity of the surface of the organic insulating layer 32 is maintained on the surface of the second inorganic insulating layer 33.

(Structure of Organic EL Display Apparatus)

The organic EL display apparatus shown in FIG. 1A and the method of manufacturing thereof are specifically described below.

The substrate 10 needs to transmit light emitted in the organic light emitting layer 43 in a case of a bottom emission type in which a display image is visually recognized with the substrate surface as a display surface, so that an insulating substrate with a light transmitting material is used. More specifically, a glass substrate, or a resin film such as polyimide is used. Using the resin film makes it possible to make the organic EL display apparatus flexible and to bond it to a curved surface.

In a case that the substrate 10 is a resin film such as polyimide, the surface thereof is not crystalline and it easily reacts with a semiconductor layer or the like, so that the base coat layer 11 is formed, although this is not required in a case that the substrate 10 is a glass substrate. As the base coat layer 11, a stacked body of $SiO_2$ having a thickness of approximately 500 nm, $SiN_x$ having a thickness of approximately 50 nm, and $SiO_2$ having a thickness of approximately 250 nm, for example, is formed.

A drive circuit comprising the TFT 20 is formed on the base coat layer 11. While only the gate electrode 23 and the cathode wiring 27 are shown in FIG. 1A, other gate wirings and signal wirings and so on are also similarly formed. Then, the semiconductor layer 21; the second semiconductor layer 211 having a high impurities concentration; the second conductor layer 25a making up the source electrode 25; and the first conductor layer 26a making up the drain electrode 26 that make up the TFT 20 are successively formed thereon. While only the TFT 20 to drive the light emitting element 40 is shown in FIG. 1A, other TFTs such as the other switching TFTs can be formed in the same configuration. In a case that the organic EL display apparatus is the top emission type having a surface opposite to the substrate 10 as a display surface, the drive circuit can be formed over the entire surface below the light emitting region of the organic light emitting element 40. However, in a case of the bottom emission type having the substrate 10 end as the display surface, the TFT cannot be formed below the light emitting region of the organic light emitting element 40. Therefore, it is necessary that the TFT be formed at the peripheral edge of a portion planarly overlapping the light emitting region. In this case, as an inclined surface is formed at a bordering portion between a portion of the peripheral edge, the portion at which the TFT or wiring is formed, and a portion under the light emitting region in which portion the TFT is not formed, unevenness occurs at the peripheral edge of the light emitting region, causing the display quality to deteriorate. Therefore, even with the bottom emission type, the same degree of planarity is needed.

In the structure shown in FIG. 1A, the semiconductor layer 21 is formed on the gate electrode 23 via the gate insulating layer 22. At the same time as the cathode wiring 27, the gate electrode 23 is formed by patterning after forming of a layer of Mo, for example, the layer having a thickness of approximately 250 nm. The gate insulating layer 22 thereon comprises $SiO_2$ having a thickness of approximately 50 nm and, moreover, the semiconductor layer 21 is formed to a thickness of 200 nm using a-Si. In the example shown in FIG. 1A, the second semiconductor layer 211 comprising a high impurities concentration is formed thereon. This is to allow a good electrical connection between the semiconductor layer 21, and the second conductor layer 25a making up and the source electrode 25 and the first conductor layer 26a making up the drain electrode 26. Therefore, an applicable region of the semiconductor layer 21 can be brought to be high in impurities concentration by doping, not forming the second semiconductor layer 211. The second conductor layer 25a making up the source electrode 25 and the first conductor layer 26a making up the drain electrode 26 and thereon a conductor layer comprising Ti/Al/Ti are formed and patterned. As described previously, the first conductor layer 26a and the second conductor layer 25a are formed such that the first portions 26a1, . . . and the second portions 25a1, . . . thereof are alternately arranged.

The contact hole 30a is formed in the planarizing layer 30 to be described below such that the second conductor layer 25a is exposed, then formed by a conductor layer being embedded into the contact hole 30a is a source contact 25b, which is further connected to the first electrode 41 of the organic light emitting element 40. A source electrode 25 is formed by the second conductor layer 25a, the source electrode comprising the source contact 25b. As described previously, there is a problem that a decrease in planarity of the organic light emitting layer 43 caused by the manner in which a metal material is embedded in the contact hole 30a, and at the apex of the source contact 25b being unevenness, so in the present embodiment it is avoided by forming the first electrode 41 of the organic light emitting element 40 as described previously while avoiding a position being immediately above the contact hole 30a. Moreover, the first conductor layer 26a making up the drain electrode 26 is connected to a drive circuit with a portion not shown at a portion not shown in the drawing.

In the example shown in FIG. 1B, the TFT 20 is formed by the first conductor layer 26a and the second conductor layer 25a being formed on the base coat layer 11, the semiconductor layer 21 being formed thereon, and the gate insulating layer 22 and the gate electrode 23 being successively formed.

While the example shown in FIG. 1C is the same as the conventional structure being converted into polycrystalline silicon, the same configuration can also be provided using a-Si. In other words, the semiconductor layer 21 comprising a-Si is formed on the base coat layer 11 and a source 21s and a drain 21d are formed by being doped to a portion to each of the source electrode 25 and the drain electrode 26 are connected and a channel 21c is formed therebetween. The gate insulating layer 22 and the gate electrode 23 are formed thereon and an interlayer insulating layer 24 comprising an $SiO_2$ layer having a thickness of approximately 300 nm and an $SiN_x$ layer having a thickness of approximately 300 nm is formed thereon. A second conductor layer 25a to be source electrode 25 is formed by embedding into the contact hole 24a to be connected to the source 21s through the interlayer insulating layer 24, and a first conductor layer 26a to be drain electrode 26 is formed so as to be connected to the drain 21d. Before the interlayer insulating layer 24 is formed, boron is doped to an electrode connecting portion of the source 21s and the drain 21d and positively-charged and activated by annealing.

On the surface of the drive circuit comprising the TFT 20 is formed a first inorganic insulating layer 31 comprising $SiN_x$ of approximately 200 nm in thickness as a barrier layer and an organic insulating layer 32 comprising a polyimide or acrylic resin, for example, of approximately 2 μm in thickness and the surface roughness is brought to less than or equal to 50 nm in the arithmetic average roughness Ra using CMP. The above-mentioned organic insulating layer can also be a photosensitive organic insulating layer into which is mixed a photosensitive material. With respect to the photosensitive organic insulating layer, the organic insulating layer 32 is formed after forming the first inorganic insulating layer 31 and the contact hole 30a is formed by exposure and development using the photolithography process. In this case, the CMP can be carried out after the contact hole 30a is formed. Even though the polishing agent for CMP gets into the contact hole 30a at the time of CMP polishing the organic insulating layer 32, as the size of the contact hole 30a is much greater than (for example, approximately 50 times) the particle diameter of the polishing agent, the polishing agent can be removed by cleaning, so that no problems occur in particular. In a case that the organic insulating layer 32 is non-photosensitive, the contact hole 30a for the organic insulating layer 32 is formed collectively with that for the first inorganic insulating layer 31. On this occasion, a contact hole 30b to form a second contact 45 to connect a cathode (a second electrode) of the organic EL display apparatus to the cathode wiring 27 is also formed in the planarizing layer 30 at the same time.

In the example shown in FIG. 1A, the second inorganic insulating layer 33 of approximately 400 nm in thickness, the second inorganic insulating layer 33 comprising $SiN_x$, for example, is formed on the organic insulating layer 32. The second inorganic insulating layer 33 being formed is preferable in that corrosion of the organic insulating layer by the etchant can be prevented at the time of etching to form the contact hole 30a. Moreover, the inorganic insulating layer maintains the planarity of the base thereof as it is, so that there is no need to polish the inorganic insulating layer. The contact holes 30a for the three layers are formed by collectively etching the three layers after forming the second inorganic insulating layer 33.

Then, a conductor layer comprising ITO, a metal such as Ag or APC, and ITO, for example, is deposited by sputtering or the like to cause a metal such as Ag or the like to be embedded into the contact hole 30a, and the first electrode (anode) 41 is formed by a deposited layer of ITO/Ag or APC/ITO in which the surface and the lowermost layer are ITO layers and Ag or APC is interposed between the ITO layers, using patterning after a conductor layer of the same metal such as Ag or APC and ITO is formed on the surface of the organic insulating layer 32 or the second inorganic insulating layer 33 (in a case that the second inorganic insulating layer 33 is formed), or in other words, the planarizing layer 30. In relation to the organic light emitting layer 43, the first electrode (anode) 41 preferably has a work function of approximately 5 eV, so that, in a case of the top emission type, the above-described material is used. The surface and the bottommost ITO layer are formed to the thickness of approximately 10 nm, and the Ag or APC is formed to the thickness of approximately 100 nm. In a case of the bottom emission type, the ITO layer is formed to the thickness of approximately greater than or equal to 300 nm and less than or equal to 1 µm, for example. An insulating bank 42, being formed of an insulating material, to insulate the anode from the cathode as well as to demarcate each pixel is formed at the peripheral edge of the above-mentioned first electrode 41, and the organic light emitting layer 43 is deposited on the first electrode 41 being surrounded by the insulating bank 42.

The organic light emitting layer 43 is deposited on the first electrode 41 being exposed while being surrounded by the insulating bank 42. While the organic light emitting layer 43 is shown as one layer in FIG. 1A, it is formed as a plurality of layers with various materials being deposited. Moreover, as the organic light emitting layer 43 is susceptible to moisture and cannot be patterned after forming it on the entire surface, it is formed by selectively vapor depositing onto only a required portion, using a mask, an organic material being evaporated or sublimed. Alternatively, the organic light emitting layer 43 can be formed by printing.

More specifically, as a layer to be in contact with the first electrode (anode electrode) 41, for example, a positive hole injection layer can be provided, which comprises a material having a high compatibility with ionization energy to improve the injectability of positive holes. A positive hole transport layer allowing trapping of electrons into the light emitting layer (as the energy barrier) as well as improving the stable transport of positive holes is formed by an amine-based material, for example, on the positive hole injection layer. Moreover, a light emitting layer to be selected in accordance with the light emitting wavelength is formed thereon using $Alq_3$ being doped with a red or green organic fluorescent material for red or green light emission, for example. Moreover, a DSA-based organic material is used as a blue color-based material. On the other hand, for coloring using a color filter (not shown), all of the light emitting layers can be formed with the same material without any doping. On the light emitting layer is further formed, using $Alq_3$, an electron transport layer capable of stably transporting electrons as well as improving the electron injectablity. These layers, each having several tens of nm in thickness, are deposited to form deposited layers being the organic light emitting layer 43. An electron injection layer capable of improving the electron injectability, such as LiF or Liq, can also be provided between this organic light emitting layer 43 and the second electrode 44. While this is not an organic layer, it is comprised within the organic light emitting layer 43 in the present specification since it is to emit light by an organic layer.

As described previously, with respect to the light emitting layer of the deposited organic light emitting layer 43, an organic material as a material according to each color of R, G, or B is not deposited, so that a color display apparatus can be provided using a color filter. In other words, the light emitting layer can be formed using the same organic material and a luminescent color can be specified using the color filter not shown. Moreover, emphasizing the light emission performance, the positive hole transport layer and the electron transport layer are preferably deposited separately using a material suitable for the light emitting layer. However, taking into account the material cost aspect, depositing can also be carried out using the same material being common to two or three colors of R, G, and B.

After the whole deposited organic light emitting layer 43 comprising the electron injection layer made of, for example, LiF is formed, the second electrode (for example, cathode) 44 is formed on the surface thereof. More specifically, the second electrode 44 is formed over the organic light emitting layer 43. The second electrode (cathode) 44 is continuously formed to be common across all the pixels. The cathode 44 is connected to the cathode wiring 27 via a first contact 28 formed in the insulating layer 22 and the insulating layer 24 of the TFT 20 and the second contact 45 formed in the planarizing layer 30. The second electrode 44 being formed by a light transmitting material, for example, a thin film Mg—Ag eutectic layer, is susceptible to corrosion with moisture, so that it is encapsulated with an encapsulation layer 46 being provided on the surface thereof. The cathode material is preferably a material whose work function is small, so that an alkaline metal or an alkaline earth metal can be used. While Mg, whose work function is small at 3.6 eV, is preferable, it is active and not stable, so that it is co-deposited with approximately 10 mass % of Ag, whose work function is 4.25 eV. Al, whose work function is also small at approximately 4.25 eV, can also be used as a cathode material with LiF being used as the under layer. Therefore, with the bottom emission type, Al can be formed thickly in this second electrode 44.

The encapsulation layer (TFE: Thin Film Encapsulation) 46, comprising an inorganic insulating layer such as $SiN_x$ or $SiO_2$, for example, can be formed with one deposited layer or with at least two deposited layers. For example, it is formed with a deposited layer having the thickness of one layer of approximately from 0.1 µm to 0.5 µm, for example, and, preferably, with deposited layers of approximately two layers. This encapsulation layer 46 is preferably formed in a plurality of layers, each with different materials. Even when pin holes are created by the encapsulation layer 46 being formed with a plurality of layers, the pin holes seldom match completely in the plurality of layers, so that the encapsulation layer 46 is completely shielded from outer air. As described previously, this encapsulation layer 46 is formed so as to completely encapsulate the organic light emitting layer 43 and the second electrode 44. The encapsulation layer 46 can also comprise an organic insulating material in between two inorganic insulating layers.

(Method of Manufacturing an Organic EL Display Apparatus)

Example 1

A method of manufacturing an organic EL display apparatus without a second inorganic insulating layer 33 of an organic EL display apparatus shown in FIG. 1A is explained with reference to flowcharts in FIGS. 4A to 4B and views of the process of manufacturing in FIGS. SA to 5G.

Figure 4A:
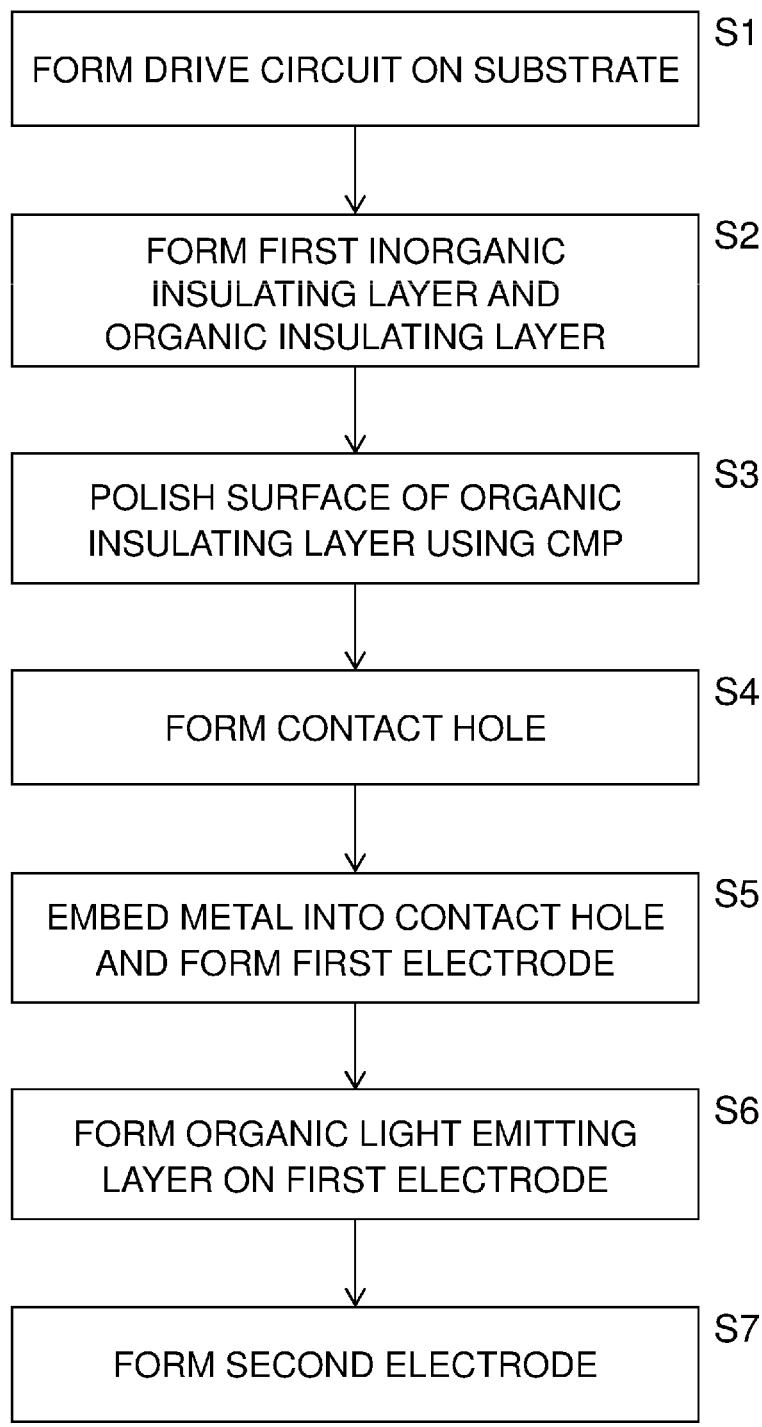
FIG. 4A shows a flowchart of a process of manufacturing an organic EL display apparatus according to Example 1, the Example 1 being without a second inorganic insulating layer in FIG. 1A.
Figure 4B:
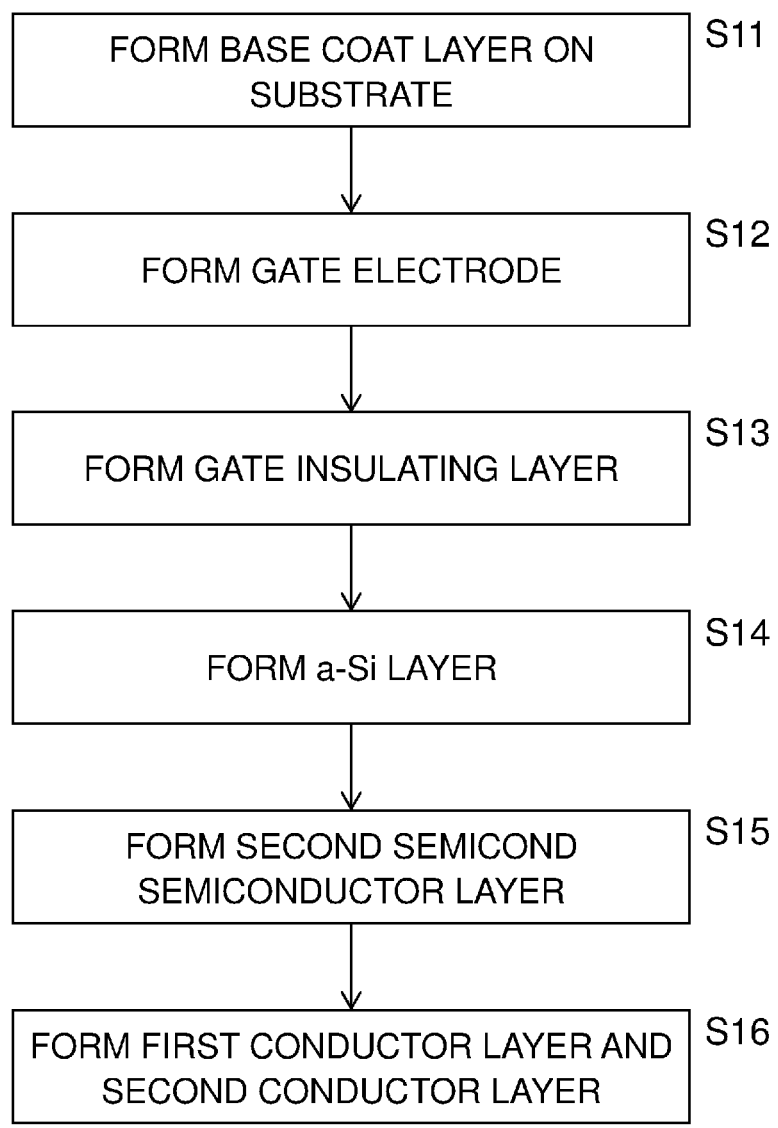
FIG. 4B shows a flowchart explaining the process of FIG. 4A in further detail.
Figure 5A:
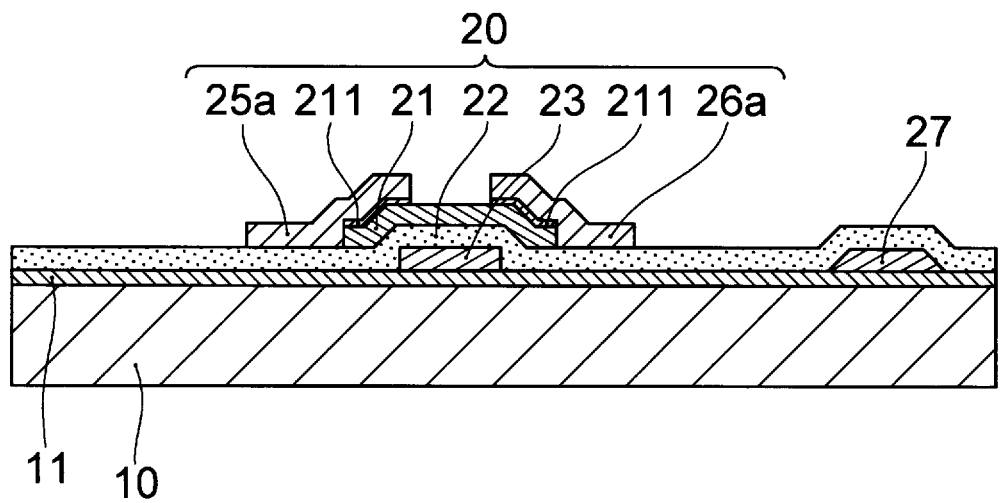
FIG. 5A shows a cross-sectional view of the process of manufacturing the organic EL display apparatus according to Example 1, the Example 1 being without the second inorganic insulating layer in FIG. 1A.

First, as shown in the flowchart in FIGS. 4A and 5A, a drive circuit comprising a TFT 20 is formed on a substrate 10 (S1 in FIG. 4A). Specifically, a base coat layer 11 is formed on the substrate 10 as shown in the flowchart in FIG. 4B. The base coat layer 11 is formed, using plasma CVD, for example, by depositing an underlayer comprising an $SiO_2$ layer having a thickness of approximately 500 nm, and an $SiN_x$ layer having a thickness of approximately 50 nm on the $SiO_2$ layer, and by further depositing, as an overlayer, an $SiO_2$ layer having a thickness of approximately 250 nm (S11).

Thereafter, a gate electrode 23, a cathode wiring 27, and other wirings such as the other gate wirings and signal wirings are formed by forming a layer of metal such as Mo by sputtering to pattern the layer of metal (S12).

Thereafter, a gate insulating layer 22 is formed (S13). The gate insulating layer 22 is formed by forming $SiO_2$ to a thickness of approximately 50 nm using plasma CVD.

Thereafter, a semiconductor layer 21 comprising an amorphous silicon (a-Si) layer is formed using plasma CVD (S14). With respect to the semiconductor layer 21, a dehydration process is carried out by an annealing process is carried out for approximately 45 minutes at the temperature of approximately 350 degrees Celsius, for example.

Thereafter, a second semiconductor layer 211 having a high impurities concentration, the second semiconductor layer 211 comprising Si, is formed in a portion to be connected to a second conductor layer 25a making up a source electrode 25 and a first conductor layer 26a making up a drain electrode 26 (S15). Impurities can be doped to the portion to which the first conductor layer 26a and the second conductor layer 25a are connected without forming a second semiconductor layer.

Thereon, a conductor layer is formed to a thickness of approximately 200 nm to 800 nm by a method such as sputtering, and the first conductor layer 26a and the second conductor layer 25a are formed by patterning (S16). The first conductor layer 26a and the second conductor layer 25a can be formed by depositing a Ti layer of approximately 300 nm and an Al layer of approximately 300 nm and depositing thereon a Ti layer of approximately 100 nm.

With the steps in the above, a drive circuit including the TFT, in other words, a portion referred to as a so-called the backplane is formed.

Figure 5B:
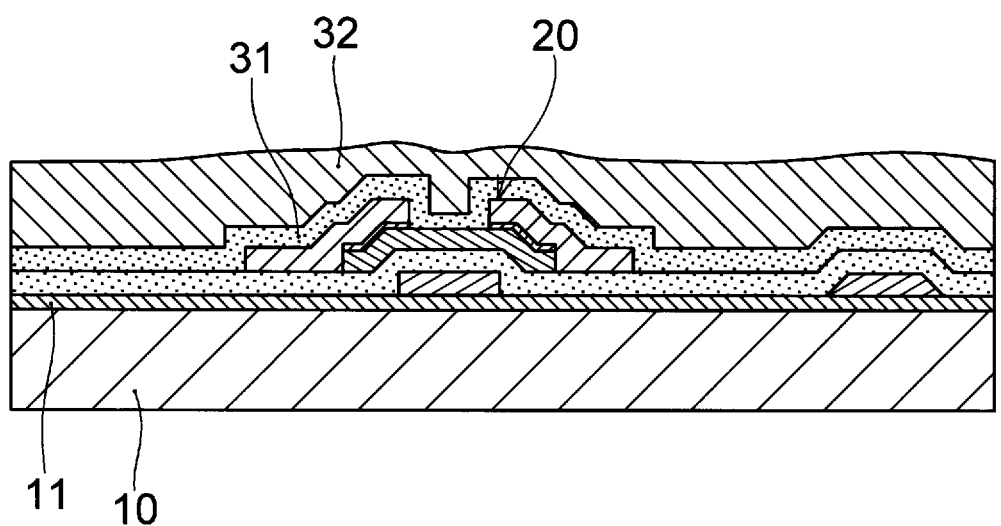
FIG. 5B shows a cross-sectional view of the process of manufacturing the organic EL display apparatus according to Example 1, the Example 1 being without the second inorganic insulating layer in FIG. 1A.

Thereafter, as shown in FIG. 5B, a first inorganic insulating layer 31 and an organic insulating layer 32 are formed on the surface of the drive circuit (S2 back in FIG. 4A). The first inorganic insulating layer 31 is formed by forming a layer of $SiN_x$ having a thickness of approximately 200 nm using plasma CVD, for example. The first inorganic insulating layer 31 functions as a barrier layer to prevent a component of the organic insulating layer 32 from penetrating toward the TFT 20. Moreover, the organic insulating layer 32 is intended to fill up a portion of unevenness present on the surface due to the formation of the TFT 20. The surface of the organic insulating layer 32 is easily planarized by applying a liquid-like resin. While methods of applying comprise a slit coat method or a spin coat method, a slit and spin coat method combining both can be used. This organic insulating layer 32 is formed so as to have the thickness of approximately 2 μm, so that a polyimide resin or an acrylic resin can be used, for example. It can be a photosensitive resin in which a photo polymerization initiator is mixed into these resins. However, a non-photosensitive resin not containing the photo polymerization initiator is preferable since it is high in purity and, even more, the surface smoothness thereof is high. More particularly, an acrylic resin is preferable.

Figure 5C:
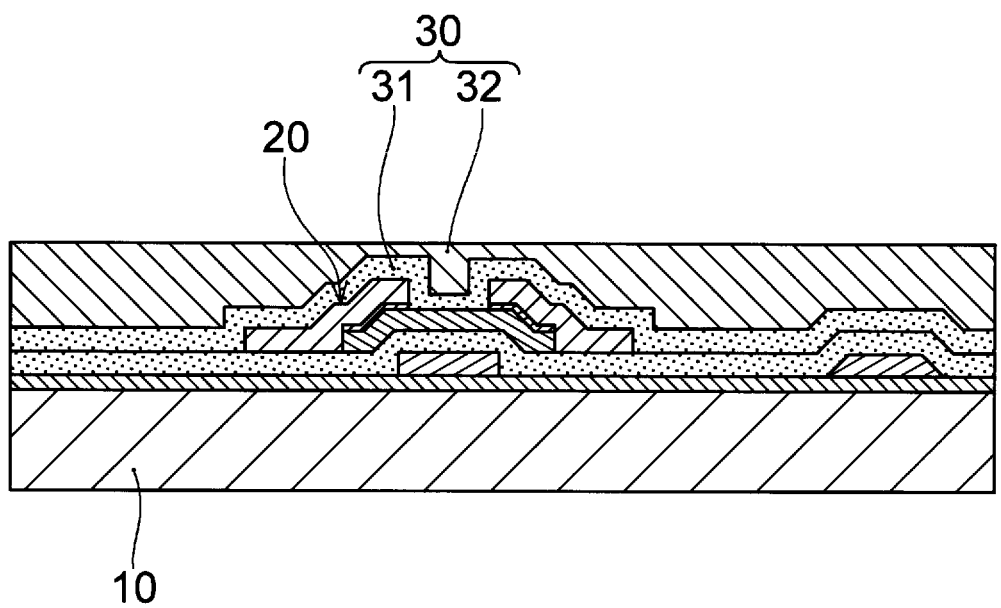
FIG. 5C shows a cross-sectional view of the process of manufacturing the organic EL display apparatus according to Example 1, the Example 1 being without the second inorganic insulating layer in FIG. 1A.

Next, as shown in FIG. 5C, the surface of the organic insulating layer 32 is polished by CMP (S3). As the liquid resin is applied and dried to obtain the organic insulating layer 32, the surface of the organic insulating layer 32 is easily planarized and, as described previously, the surface thereof is formed to approximately 100 nm to 300 nm in arithmetic average surface roughness Ra. However, the present inventor has found that, as described previously, the planarity of the planarizing layer obtained by only applying the liquid resin and drying causes color non-uniformity and/or luminance non-uniformity, so that the light emitting characteristics cannot be satisfied adequately. Therefore, using CMP, the surface is polished to the arithmetic average roughness Ra of less than or equal to 50 nm. While the smaller the planarity the more preferable, such a high degree of planarity as to be less than or equal to 20 nm as shown in Patent Document 1 is not required. When the planarity is less than or equal to 50 nm, the color non-uniformity and/or luminance non-uniformity does not appear to such a degree as to be problematic. The polishing is carried out by CMP the surface of the organic insulating layer 32 while supplying, for example, a Ceria ($CeO_2$)-based slurry or a fumed silica-based slurry along with water and alcohol.

Figure 5D:
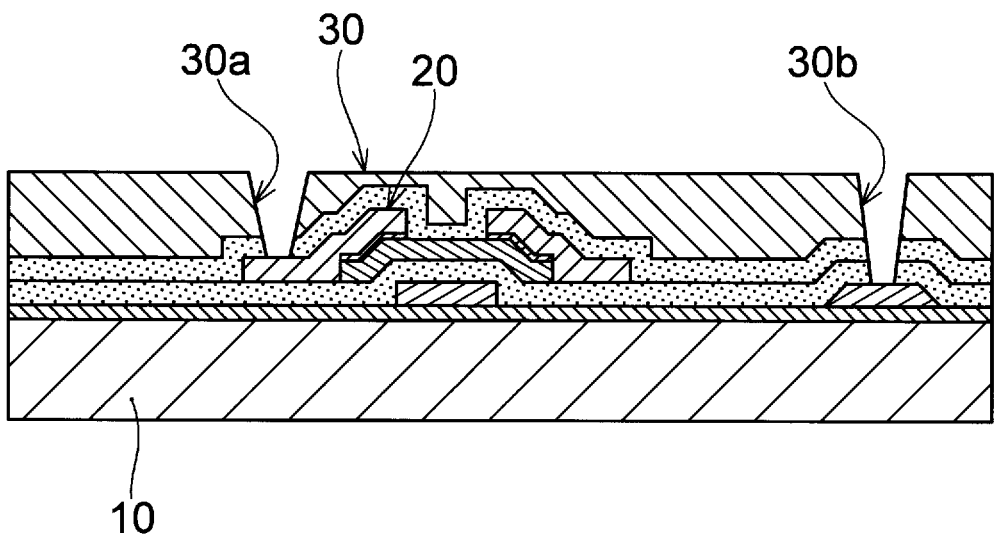
FIG. 5D shows a cross-sectional view of the process of manufacturing the organic EL display apparatus according to Example 1, the Example 1 being without the second inorganic insulating layer in FIG. 1A.

Thereafter, as shown in FIG. 5D, a contact hole 30a to reach the TFT 20 is formed in the planarizing layer 30 (S4). Forming of the contact hole 30a is carried out using etching such as dry etching after a resist mask is formed. In a case of collectively etching layers in which an inorganic insulating layer and an organic insulating layer co-exist, such as the planarizing layer 30, the etching rates of both of the layers differ from each other, so that using dry etching in particular is preferable for making it unlikely for a stepped portion to be produced at the interface of both of the layers. When the stepped portion is produced, the interior of the contact hole 30a is not completely embedded with metal, making it likely to produce the problem of the contact resistance of the metal with the source electrode 25 increasing.

Figure 5E:
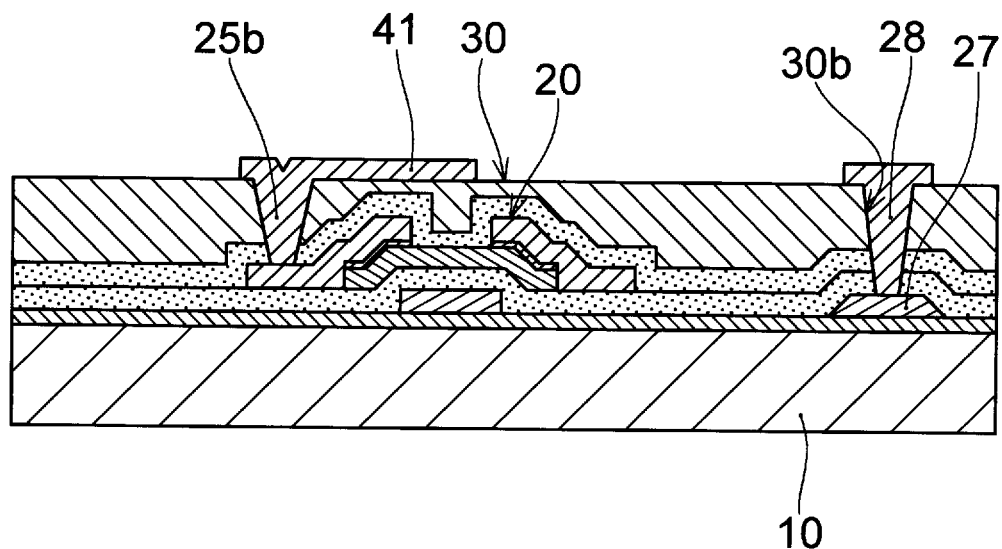
FIG. 5E shows a cross-sectional view of the process of manufacturing the organic EL display apparatus according to Example 1, the Example 1 being without the second inorganic insulating layer in FIG. 1A.

Thereafter, as shown in FIG. 5E, a metal is embedded at the interior of the contact hole 30a and a first electrode 41 for the organic light emitting element 40 is formed in a given region (S5). More specifically, using sputtering, for example, an underlayer in which are deposited an ITO layer having a thickness of approximately 10 nm and an Ag layer or an APC layer having a thickness of approximately 100 nm, and an overlayer comprising an ITO layer having a thickness of approximately 10 nm are formed. As a result, a deposited layer of the ITO, the metal layer, and the ITO layer is formed on the surface of the planarizing layer 30 as well as the ITO and metal being embedded at the interior of the contact hole 30a. Thereafter, the deposited layer of the ITO, the metal and the ITO are patterned to form the first electrode 41.

Figure 5F:
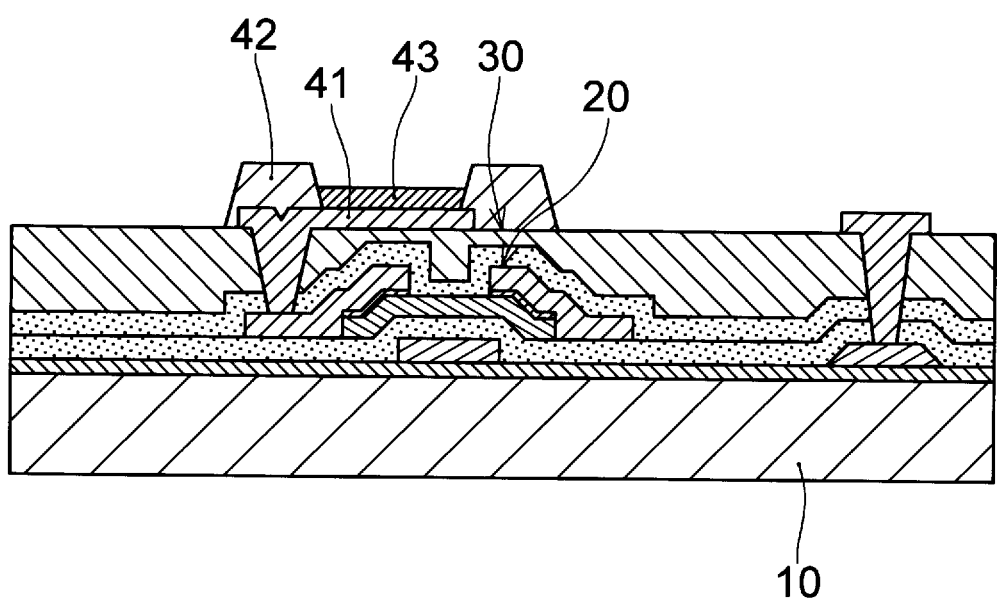
FIG. 5F shows a cross-sectional view of the process of manufacturing the organic EL display apparatus according to Example 1, the Example 1 being without the second inorganic insulating layer in FIG. 1A.

Thereafter, as shown in FIG. 5F, an organic light emitting layer 43 is formed on the first electrode 41, avoiding a portion being immediately above the contact hole 30. (S6). Specifically, an insulating bank 42 to prevent the cathode and the anode from being in contact with each other as well as to demarcate each pixel is formed at the peripheral edge of the first electrode 41. The insulating bank 42 can be an inorganic insulating layer such as $SiO_2$, or an organic insulating layer such as a polyimide resin or an acrylic resin. The insulating bank 42 is formed on the entire surface and patterned such that a given location of the first electrode 41 is exposed. The insulating bank 42 is formed to a height of approximately 1 µm. As described previously, while various organic materials are deposited in forming of the organic light emitting layer 43, depositing of the organic materials is carried out by vacuum vapor deposition, for example, in which case the organic light emitting layer 43 is formed through an aperture of a vapor deposition mask, the vapor deposition mask having the aperture corresponding to a desired sub-pixel of R, G, or B. A layer such as LiF to improve the injectability of electrons can be formed on the surface of the organic light emitting layer 43. The organic light emitting layer 43 can also be formed by printing such as inkjet printing, not by vapor deposition. Ag or APC is used in the first electrode 41 for the reason that light emitted in the organic light emitting layer 43 is reflected for use as the top emission type.

Figure 5G:
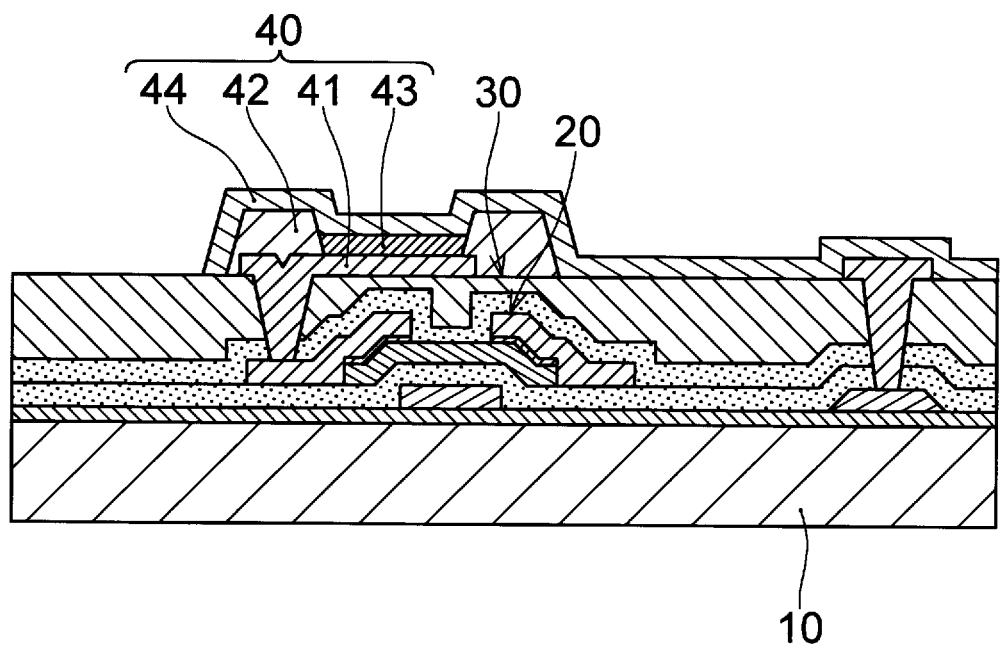
FIG. 5G shows a cross-sectional view of the process of manufacturing the organic EL display apparatus according to Example 1, the Example 1 being without the second inorganic insulating layer in FIG. 1A.

Thereafter, as shown in FIG. 5G, a second electrode (cathode) 44 is formed on the organic light emitting layer 43 (S7). The second electrode 44 is formed by forming, on the entire surface, a thin layer of Mg—Ag eutectic layer using vapor deposition, for example, to make it a cathode by patterning. The second electrode 44 is formed also on the second contact 45 and connected to the cathode wiring 27 via the second contact 45 and the first contact 28. With respect to the Mg—Ag eutectic layer, Mg and Ag have different melting points, so that Mg and Ag are evaporated from different crucibles to be eutecticized at the time of formation of the Mg—Ag eutectic layer. With the Mg—Ag eutectic layer comprising Mg at approximately 90 mass % and Ag at approximately 10 mass %, the second electrode 44 is formed to the thickness of approximately 10 nm to 20 nm, for example.

An encapsulation layer 46 to protect the second electrode 44 and the organic light emitting layer 43 from moisture or oxygen is formed on the above-mentioned second electrode 44. The encapsulation layer 46 protects the second electrode 44 and the organic light emitting layer 43 being susceptible to moisture or oxygen, so that an inorganic insulating layer such as $SiO_2$ or $SiN_x$ being difficult to absorb moisture, is formed using CVD. Even more, the encapsulation layer 46 is formed such that the end portion thereof comes into close contact with an inorganic layer such as a second inorganic insulating layer 33. This is because, while joining of the inorganic layers together causes them to be joined in close contact with each other, it is difficult to obtain a complete joining, with an organic layer, having a good contactability. Therefore, in a case of no second inorganic insulating layer 33 shown in FIG. 1A, it is preferable to remove a portion of the organic insulating layer 32 to cause the organic insulating layer 32 to be joined with the first inorganic insulating layer being the underlayer thereof. This makes it possible to fully prevent penetration of moisture.

Example 2

In the method of manufacturing an organic EL display apparatus according to Example 1 as shown in FIGS. 4A and 4B and FIGS. 5A to 5G, the planarizing layer 30 is formed of the first inorganic insulating layer 31 and the organic insulating layer 32 (a structure without the second inorganic insulating layer 33 of the structure in FIG. 1A). Even with such a structure, the surface of the organic insulating layer 32 is polished and the first electrode 41 is formed on the surface thereof. Therefore, the surface of the planarizing layer 30 is planarized, so that there are no problems. However, there is a problem that, when wet etching is carried out at the time of forming the contact hole 30a, moisture easily penetrates the organic insulating layer 32. In a case that moisture penetrates the organic insulating layer 32, the material of the organic light emitting layer 43 or the second electrode 44 could deteriorate when moisture leaches out at the time the light emitting element is formed and is in operation. Therefore, the second inorganic insulating layer 33 is preferably formed on the surface of the organic insulating layer 32, the structure of which is shown in FIG. 1A. The above-mentioned method of manufacturing is explained with reference to FIGS. 6A to 6E.

Figure 6A:
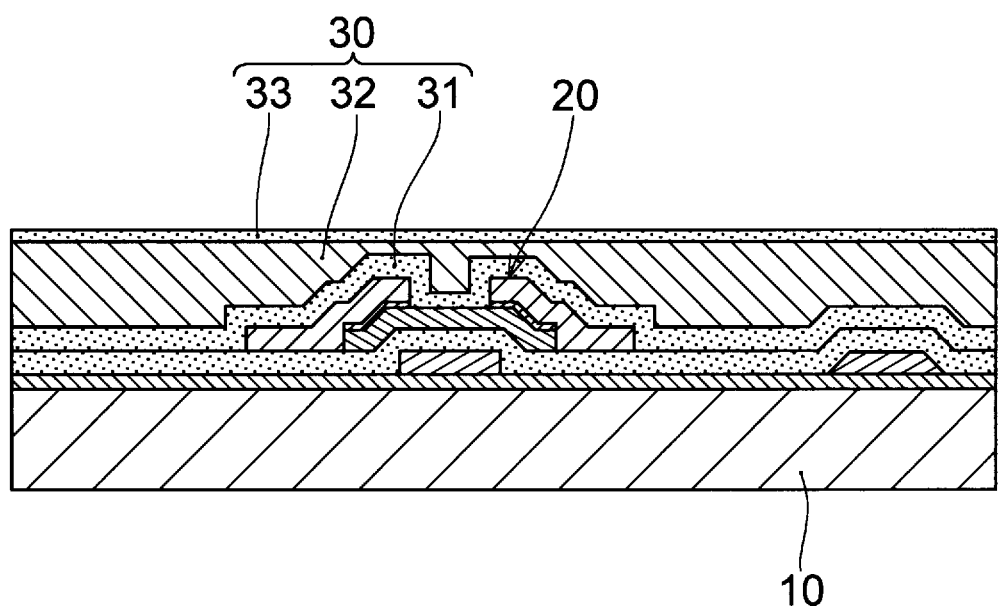
FIG. 6A shows a cross-sectional view of the process of manufacturing the organic EL display apparatus in FIG. 1A according to Example 2.

Up to the process shown in previously-described FIG. 5C, the above-mentioned method is carried out in the same manner as that according to Example 1. In other words, the surface of the organic insulating layer 32 is planarized using CMP. Thereafter, as shown in FIG. 6A, the second inorganic insulating layer 33 is formed by forming $SiN_x$ having a thickness of approximately 200 nm using plasma CVD in the same manner as the first inorganic insulating layer 31. The second inorganic insulating layer 33 is formed by depositing an inorganic material using a method such as sputtering or the like, and, even more, it is very thin, so that the planarity of the polished surface of the organic insulating layer 32 is maintained as it is. Therefore, even for the surface of the second inorganic insulating layer 33, the planarity being less than or equal to 50 nm in arithmetic average roughness Ra is obtained. In other words, while the planarizing layer 30 is configured by the first inorganic insulating layer 31, the organic insulating layer 32, and the second inorganic insulating layer 33 in the Example 2, the surface of the planarizing layer 30 is formed to a planar surface being less than or equal to 50 nm in the arithmetic average roughness Ra.

Figure 6B:
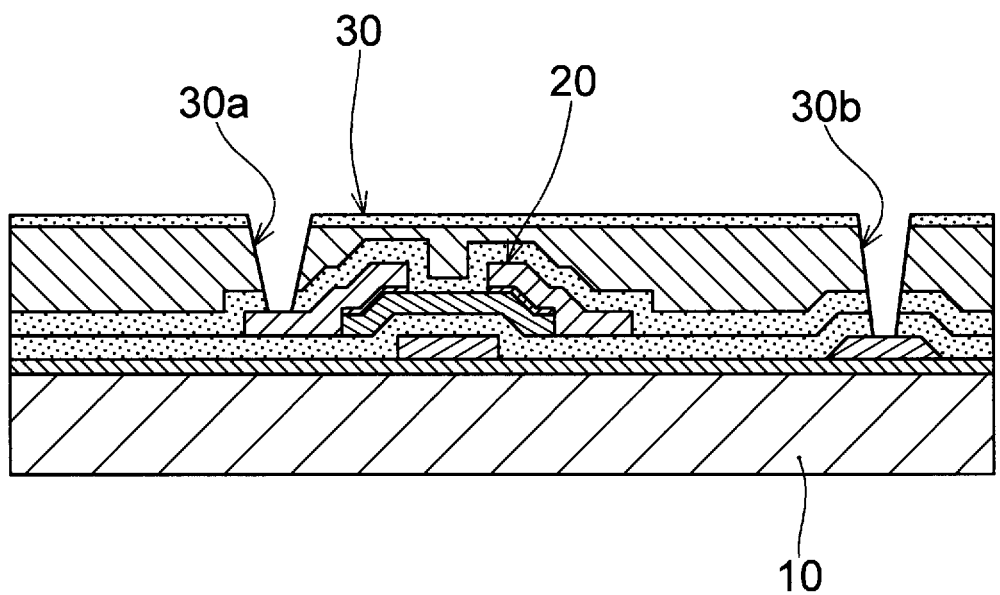
FIG. 6B shows a cross-sectional view of the process of manufacturing the organic EL display apparatus in FIG. 1A according to Example 2.

While the below-described process is the same as that in the previously-described Example 1, as shown in FIG. 6B, the contact hole 30a is formed in the planarizing layer 30. The method for forming it is the same as that according to Example 1, so that explanations thereof will be omitted.

Figure 6C:
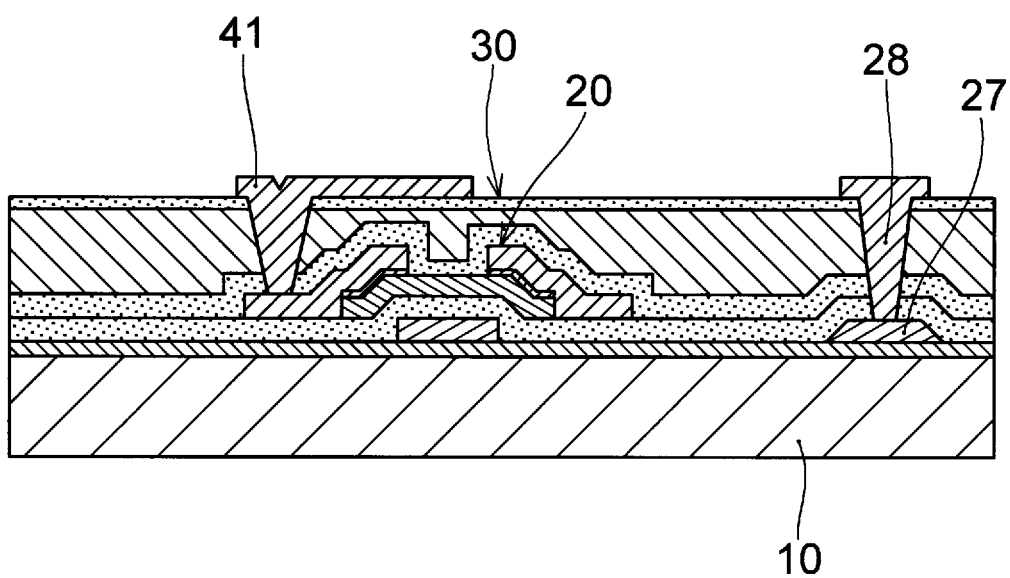
FIG. 6C shows a cross-sectional view of the process of manufacturing the organic EL display apparatus in FIG. 1A according to Example 2.

Thereafter, as shown in FIG. 6C, a metal is embedded at the interior of the contact hole 30a and the first electrode 41 for the organic light emitting element 40 is formed on the surface of the planarizing layer 30. This method is also the same as the previously-described process in FIG. 5E, so that the explanation thereof will be omitted.

Figure 6D:
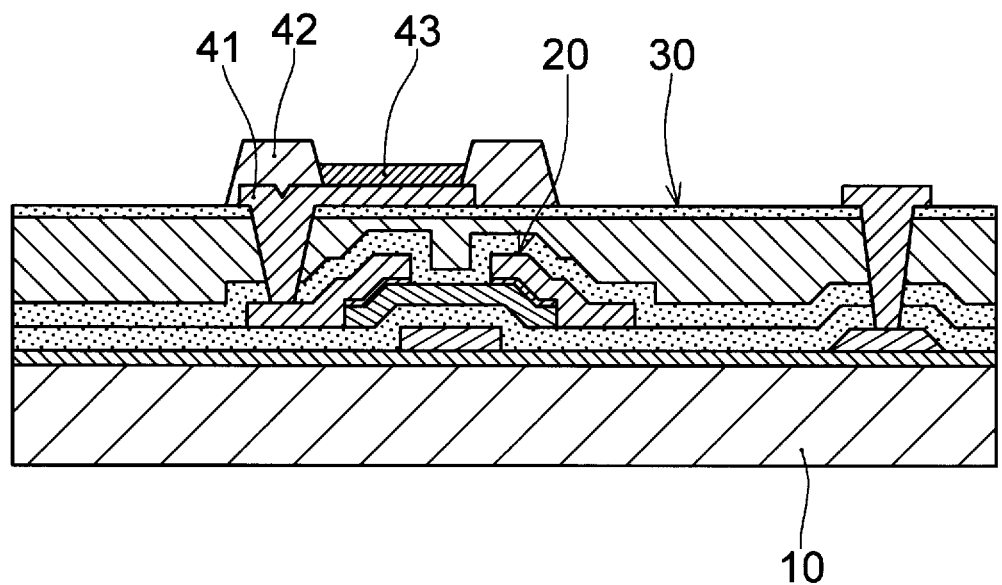
FIG. 6D shows a cross-sectional view of the process of manufacturing the organic EL display apparatus in FIG. 1A according to Example 2.

Thereafter, as shown in FIG. 6D, after the insulating bank 42 is formed, the organic light emitting layer 43 is formed using a method such as vacuum deposition, for example. This method is also the same as the process shown in FIG. 5F according to the previously-described Example 1, so that explanations thereof will be omitted.

Figure 6E:
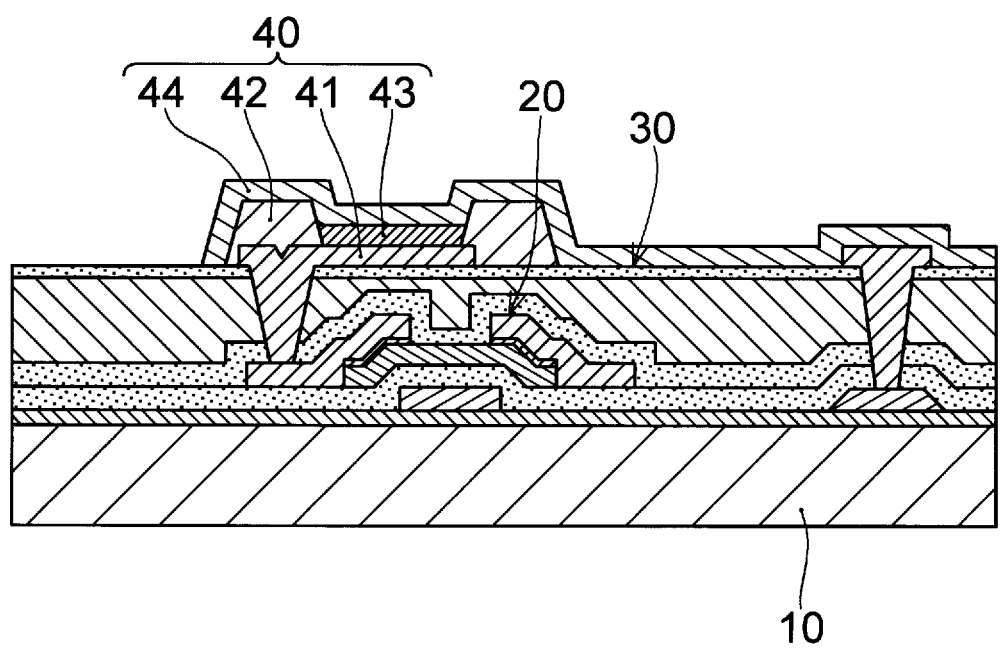
FIG. 6E shows a cross-sectional view of the process of manufacturing the organic EL display apparatus in FIG. 1A according to Example 2.

Thereafter, as shown in FIG. 6E, the second electrode 44 is formed on the entire surface. This process is also the same as the process shown in FIG. 5G according to the previously-described Example 1, so that forming can be carried out using the same method. Thereafter, forming the encapsulation layer 46 on the surface allows the organic EL display apparatus shown in FIG. 1A to be obtained.

SUMMARY (1) An organic EL display apparatus according to one embodiment of the present invention comprises: a substrate having a surface on which a drive circuit comprising a thin film transistor is formed, a planarizing layer to planarize the surface of the substrate by covering the drive circuit, and an organic light emitting element, the organic light emitting element comprising a first electrode being formed on a surface of the planarizing layer and connected to the drive circuit, an organic light emitting layer being formed on the first electrode, and a second electrode being formed on the organic light emitting layer, wherein the thin film transistor comprises a gate electrode, a drain electrode, a source electrode, and a region to be a channel of the thin film transistor, and has a stack structure comprising the gate electrode, a semiconductor layer, and a first conductor layer and a second conductor layer, the first conductor layer making up the drain electrode being formed in connection with the semiconductor layer and the second conductor layer making up the source electrode; wherein the first conductor layer and the second conductor layer are arranged such that portions of each of the first conductor layer and the second conductor layer are lined up alternately in a predetermined direction; and wherein the channel is the semiconductor layer being sandwiched between a portion of the first conductor layer and a portion of the second conductor layer, the portion of the first conductor layer and a portion of the second conductor layer neighboring each other.

According to the present embodiment, while using a-Si, the channel width W of the drive TFT of an organic light emitting element can be substantially increased to increase the W/L from 50 to 500 to obtain a sufficient drive current. As a result, a TFT having a very stable quality can be obtained as well as achieving a cost reduction with a very simple manufacturing process without the need for laser irradiation or the need to convert an a-Si layer to polycrystalline silicon. Therefore, an organic EL display apparatus being excellent in display quality is obtained because of achieving a stable drive current and substantially suppressing display non-uniformity such as color or luminance non-uniformity.

(2) It is preferable that each of the first conductor layer and the second conductor layer is formed in a comb in a planer shape and comb-tooth portions of each of the first conductor layer and the second conductor layer are formed such that they engage with each other. Thereby it is very easily obtained the neighboring structure between a first portion of a first conductor layer and a second portion of a second conductor layer.

(3) It is preferable that, with a region being sandwiched between a portion of the first conductor layer and a portion of the second conductor layer neighboring each other being in a plurality, and the semiconductor layer comprising an amorphous semiconductor, and, when a sum of the plurality of the lengths of a part at which the portion of the first conductor layer and the portion of the second conductor layer oppose is W, and an interval between the portion of the first conductor layer and the portion of the second conductor layer neighboring each other is L, W/L is greater than or equal to 50 and less than or equal to 500. Then, a large current is obtained even using a-Si, because the region which the portion of the first conductor layer and the portion of the second conductor layer are opposed become large.

(4) A light emitting region of the light emitting element can be formed in a rectangular shape and the thin film transistor is formed in an under layer of the light emitting region and a part which the portion of the first conductor layer and the portion of the second conductor layer oppose can be formed along a longer side of the rectangular shape. Thereby, the channel width can be surely increased without taking into account a channel to be formed at the tip of the portions.

(5) The gate electrode can be formed over the entire range of a length of a plurality of parts at which the portion of the first conductor layer and the portion of the second conductor layer oppose, the portion of the first conductor layer and the portion of the second conductor layer neighboring each other, to increase the channel length.

(6) The planarizing layer being formed on the thin film transistor being a stack structure of a first inorganic insulating layer and an organic insulating layer and a surface of the organic insulating layer being formed to no greater than 50 nm in arithmetic average roughness Ra makes it possible to make a first electrode of an organic light emitting element a planar surface. As a result, even when being microscopically planar, there is no unevenness, and the normal direction of the surface of an organic light emitting layer of a small sub-pixel matches the normal direction of a display surface. Therefore, a problem that some of lights for a small sub-pixel traveling in a slanted direction is eliminated, making it possible to eliminate factors to decrease the display quality, such as luminance non-uniformity or color non-uniformity. As a result, an organic EL display apparatus having a highly excellent display quality can be obtained.

(7) The planarizing layer being formed in a three-layer structure by a second insulating layer being formed on the organic insulating layer; and a contact hole to electrically connect the organic light emitting element and the thin film transistor being collectively formed in the three-layer structure are preferable in suppressing penetration of moisture since an organic insulating layer is protected by an inorganic insulating layer.

(8) A method of manufacturing an organic EL display apparatus according to another embodiment of the present invention comprises: forming a drive circuit on a substrate, the drive circuit comprising a thin film transistor; forming, on a surface of the drive circuit, a first inorganic insulating layer and an organic insulating layer; polishing a surface of the organic insulating layer by CMP; forming a contact hole in the organic insulating layer and the first inorganic insulating layer, the contact hole to reach the thin film transistor; embedding a metal at an interior of the contact hole and forming a first electrode at a given region; forming an organic light emitting layer on the first electrode; and forming a second electrode on the organic light emitting layer, wherein the thin film transistor comprises a gate electrode, a gate insulating layer, and a region to be a channel and is formed with a stack structure comprising the gate electrode, a semiconductor layer being amorphous, a first conductor layer to make up a drain electrode being formed in connection to the semiconductor layer, and a second conductor layer to make up a source electrode being formed in connection to the semiconductor layer; wherein the first conductor layer and the second conductor layer are formed such that portions of the first conductor layer and the second conductor layer are alternately lined up in a predetermined direction; and wherein the channel is the semiconductor layer being sandwiched between a portion of the first conductor layer and a portion of the second conductor layer, the portion of the first conductor layer and the portion of the second conductor layer neighboring each other.

According to the present embodiment, since using a-Si, a drive TFT of an organic light emitting element can be formed, eliminating the need to convert an a-Si layer to polycrystalline silicon. As a result, a manufacturing process becomes very simple and a likelihood of variation of TFT characteristics based on variations of intensity of laser irradiated is eliminated, the performance of each TFT becomes uniform, and display non-uniformity of the display apparatus such as color or luminance non-uniformity is suppressed.

(9) Forming the thin film transistor can comprise forming the gate electrode extending along a predetermined direction on the substrate; forming the gate electrode extending along the predetermined direction on a substrate; forming the gate insulating layer on the gate electrode; forming the semiconductor layer being amorphous on the gate insulating layer so as to cover the gate electrode along the predetermined direction; and forming the first conductor layer having a plurality of first portions being connected to the semiconductor layer and extending along a direction to cross the predetermined direction and the second conductor layer having a plurality of second portions being connected to the semiconductor layer and extending along a direction to cross the predetermined direction such that the first portions and the second portions are alternately arranged to provide a TFT having the reverse-staggered structure.

(10) Forming the thin film transistor can comprise forming, on a substrate, the first conductor layer having a plurality of first portions extending along a direction to cross the predetermined direction, and the second conductor layer having a plurality of second portions extending along a direction to cross the predetermined direction such that the first portions and the second portions are alternately arranged; forming, on the first conductor layer and the second conductor layer, the semiconductor layer so as to be connected to the first conductor layer and the second conductor layer, the semiconductor layer being amorphous, and extending along the predetermined direction; forming the gate insulating layer on the semiconductor layer; and forming the gate electrode such that portions at which the first portion and the second portion oppose are covered with the gate insulating layer to provide a TFT having the staggered structure.

(11) Each of the first conductor layer and the second conductor layer can be formed in a comb shape and comb-tooth portions of each of the first conductor layer and the second conductor layer are formed such that they engage with each other.

(12) A second semiconductor layer having a high impurities concentration is interposed between the semiconductor layer being amorphous and the first and second conductor layers.

(13) A second inorganic insulating layer can be formed on the organic insulating layer and the contact hole can be collectively formed by dry etching in a three-layer structure comprising the second inorganic insulating layer, the organic insulating layer, and the first inorganic insulating layer to form a contact hole continuously without a stepped portion being produced in the contact hole.

(14) forming of the contact hole can be carried out by supplying a neutral Ceria-based polishing material or a fumed silica-based slurry, along with water and alcohol to bring the surface planarity to less than or equal to 50 nm in arithmetic average roughness Ra.

10 Substrate
20 TFT
21 Semiconductor layer
21c Channel
211 Second semiconductor layer
25 Source electrode
25a Second conductor layer
25a1, 25a2 . . . Second portions
26 Drain electrode
26a First conductor layer
26a1, 26a2 . . . First portions
30 Planarizing layer
31 First inorganic insulating layer
32 Organic insulating layer
33 Second inorganic insulating layer
40 Organic light emitting element
41 First electrode (anode)
43 Organic light emitting layer
44 Second electrode (cathode)

The invention claimed is:

1. An organic electroluminescent (EL) display apparatus comprising:
a light emitting element comprising an organic light emitting element,
a substrate having a surface on which a drive circuit comprising a thin film transistor for driving the light emitting element is formed, and
a planarizing layer to planarize the surface of the substrate by covering the drive circuit,
wherein the organic light emitting element comprises a first electrode connected to the drive circuit, an organic light emitting layer, and a second electrode being formed on the organic light emitting layer,
wherein the thin film transistor for driving comprises a gate electrode, a drain electrode, a source electrode, and a semiconductor layer to be a channel of the thin film transistor for driving, and has a stack structure of the gate electrode, the semiconductor layer, and a first conductor layer and a second conductor layer, the first conductor layer to make up the drain electrode being formed in connection with the semiconductor layer and the second conductor layer to make up the source electrode being formed in connection with the semiconductor layer;
wherein the first conductor layer and the second conductor layer are arranged such that portions of each of the first conductor layer and the second conductor layer are lined up alternately in a predetermined direction;
wherein the channel is the semiconductor layer being sandwiched between each portion of the first conductor layer and each portion of the second conductor layer, the each portion of the first conductor layer and the each portion of the second conductor layer neighboring each other;
wherein the channel comprises a plurality of regions, each of the regions being sandwiched between the each portion of the first conductor layer and the each portion of the second conductor layer neighboring each other, and the semiconductor layer comprises an amorphous semiconductor, and, when a sum of a plurality of lengths of a part at which the each portion of the first conductor layer and the each portion of the second conductor layer oppose is W, and an interval between the each portion of the first conductor layer and the each portion of the second conductor layer neighboring each other is L, W/L is greater than or equal to 50 and less than or equal to 500; and
wherein the planarizing layer being formed on the thin film transistor for driving is a stack structure comprising a first inorganic insulating layer and an organic insulating layer, and a surface of the organic insulating layer is formed to greater than or equal to 20 nm and no greater than 50 nm in arithmetic average roughness Ra, and the first electrode is directly contacting the planarizing layer and the organic light emitting layer is directly contacting the first electrode, thereby a normal direction of a surface of the organic light emitting layer matching a normal direction of a display surface, wherein a topmost surface of the organic light emitting layer is flat, wherein the planarizing layer is formed in a three-layer structure by a second inorganic insulating layer being formed on the organic insulating layer; and a contact hole to electrically connect the organic light emitting element and the thin film transistor for driving is formed without a stepped portion in the three-layer structure.

2. The organic EL display apparatus according to claim 1, wherein each of the first conductor layer and the second conductor layer is formed in a comb in a planer shape and comb-tooth portions of each of the first conductor layer and the second conductor layer are formed such that they engage with each other.

3. The organic EL display apparatus according to claim 1, wherein a light emitting region of the light emitting element is formed in a rectangular shape and the thin film transistor for driving is formed in an under layer of the light emitting region and a part at which the each portion of the first conductor layer and the each portion of the second conductor layer oppose is formed along a longer side of the rectangular shape.

4. The organic EL display apparatus according to claim 1, wherein the gate electrode is formed over the entire range of a length of a plurality of parts at which the each portion of the first conductor layer and the each portion of the second conductor layer oppose, the each portion of the first conductor layer and the each portion of the second conductor layer neighboring each other.

5. A method of manufacturing an organic electroluminescent (EL) display apparatus, the method comprising:
    forming a drive circuit on a substrate, the drive circuit comprising a thin film transistor for driving a light emitting element;
    forming, on a surface of the drive circuit, a planarizing layer comprising a stack structure of a first inorganic insulating layer and an organic insulating layer;
    polishing a surface of the organic insulating layer by CMP;
    forming a contact hole in the organic insulating layer and the first inorganic insulating layer, the contact hole to reach the thin film transistor for driving;
    embedding a metal at an interior of the contact hole and forming a first electrode at a given region;
    forming an organic light emitting layer on the first electrode; and
    forming a second electrode on the organic light emitting layer,
    wherein the thin film transistor for driving comprises a gate electrode, a gate insulating layer, a drain electrode, a source electrode and a semiconductor layer to be a channel of the thin film transistor for driving and is formed with a stack structure comprising the gate electrode, the semiconductor layer, a first conductor layer to make up the drain electrode being formed in connection with the semiconductor layer, and a second conductor layer to make up the source electrode being formed in connection with the semiconductor layer;
    wherein the first conductor layer and the second conductor layer are formed such that portions of the first conductor layer and the second conductor layer are alternately lined up in a predetermined direction;
    wherein the channel is the semiconductor layer being sandwiched between each portion of the first conductor layer and each portion of the second conductor layer, the each portion of the first conductor layer and the each portion of the second conductor layer neighboring each other,
    wherein the channel comprises a plurality of regions, each of the regions being sandwiched between the each portion of the first conductor layer and the each portion of the second conductor layer neighboring each other, and the semiconductor layer comprises an amorphous semiconductor, and, when a sum of a plurality of lengths of a part at which the each portion of the first conductor layer and the each portion of the second conductor layer oppose is W, and an interval between the each portion of the first conductor layer and the each portion of the second conductor layer neighboring each other is L, W/L is greater than or equal to 50 and less than or equal to 500; and
    wherein a surface of the organic insulating layer of the planarizing layer being formed on the thin film transistor for driving is formed to greater than or equal to 20 nm and no greater than 50 nm in arithmetic average roughness Ra, and the first electrode is directly contacting the planarizing layer and the organic light emitting layer is directly contacting the first electrode, thereby a normal direction of a surface of the organic light emitting layer matching a normal direction of a display surface,
    wherein a topmost surface of the organic light emitting layer is flat,
    wherein a second inorganic insulating layer is formed on the organic insulating layer and the contact hole is collectively formed by dry etching in a three-layer structure comprising the second inorganic insulating layer, the organic insulating layer, and the first inorganic insulating layer,
    wherein the surface of the organic insulating layer is polished by carrying out polishing with a neutral Ceria-based polishing material or a fumed silica-based slurry, along with water and alcohol.

6. The method of manufacturing an organic EL display apparatus according to claim 5, wherein forming the thin film transistor for driving comprises:
    forming the gate electrode extending along the predetermined direction on the substrate;
    forming the gate insulating layer on the gate electrode;
    forming the semiconductor layer being amorphous on the gate insulating layer so as to cover the gate electrode along the predetermined direction; and
    forming the first conductor layer having a plurality of first portions being connected to the semiconductor layer and extending along a direction to cross the predetermined direction and the second conductor layer having a plurality of second portions being connected to the semiconductor layer and extending along a direction to cross the predetermined direction such that the first portions and the second portions are alternately arranged.

7. The method of manufacturing an organic EL display apparatus according to claim 5, wherein forming the thin film transistor for driving comprises:
    forming, on the substrate, the first conductor layer having a plurality of first portions extending along a direction to cross the predetermined direction, and the second conductor layer having a plurality of second portions extending along a direction to cross the predetermined direction such that the first portions and the second portions are alternately arranged;

forming, on the first conductor layer and the second conductor layer, the semiconductor layer so as to be connected to the first conductor layer and the second conductor layer, the semiconductor layer being amorphous, and extending along the predetermined direction;

forming the gate insulating layer on the semiconductor layer; and forming the gate electrode such that portions at which the first portions and the second portions oppose are covered with the gate insulating layer.

8. The method of manufacturing an organic EL display apparatus according to claim 5, wherein each of the first conductor layer and the second conductor layer is formed in a comb shape and comb-tooth portions of each of the first conductor layer and the second conductor layer are formed such that they engage with each other.

9. The method of manufacturing an organic EL display apparatus according to claim 5, wherein a second semiconductor layer having a high impurities concentration is interposed between the semiconductor layer being amorphous and the first and second conductor layers.

* * * * *